(12) United States Patent
Oh

(10) Patent No.: US 12,067,945 B2
(45) Date of Patent: Aug. 20, 2024

(54) GATE DRIVER AND ELECTROLUMINESCENT DISPLAY APPARATUS INCLUDING THE SAME

(71) Applicant: LG Display Co., Ltd., Seoul (KR)

(72) Inventor: Kil Hwan Oh, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/980,147

(22) Filed: Nov. 3, 2022

(65) Prior Publication Data

US 2023/0197012 A1 Jun. 22, 2023

(30) Foreign Application Priority Data

Dec. 22, 2021 (KR) ........................ 10-2021-0185479

(51) Int. Cl.
*G09G 3/3266* (2016.01)

(52) U.S. Cl.
CPC .................. *G09G 3/3266* (2013.01)

(58) Field of Classification Search
CPC .. G09G 3/3233; G09G 3/3266; G09G 3/3677; G09G 3/3674; G09G 2300/0819; G09G 2300/0842; G09G 2300/0861; G09G 2300/0852; G09G 2300/0426; G09G 2310/0289; G09G 2310/0251; G09G 2310/0286; G09G 2310/0267; G09G 2310/08; G09G 2310/061; G09G 2320/0219; G09G 2320/043; G09G 2320/0233; G09G 2330/021; G11C 19/18; G11C 19/28
See application file for complete search history.

(56) References Cited

U.S. PATENT DOCUMENTS

| | | | | |
|---|---|---|---|---|
| 11,508,297 | B2 * | 11/2022 | Feng | G11C 19/28 |
| 2017/0186394 | A1 * | 6/2017 | Park | G09G 3/3677 |
| 2020/0066211 | A1 * | 2/2020 | Lee | G09G 3/3225 |
| 2021/0366400 | A1 * | 11/2021 | Feng | G09G 3/3266 |
| 2022/0114967 | A1 * | 4/2022 | Xue | G09G 3/3266 |
| 2022/0208104 | A1 * | 6/2022 | Chang | G09G 3/3258 |
| 2022/0309978 | A1 * | 9/2022 | Feng | G09G 3/20 |
| 2022/0358873 | A1 * | 11/2022 | Hwang | G09G 3/3266 |
| 2023/0008896 | A1 * | 1/2023 | Noh | G09G 3/3266 |
| 2023/0105266 | A1 * | 4/2023 | Hong | G09G 3/3233 345/212 |
| 2023/0110320 | A1 * | 4/2023 | Shin | G09G 3/3233 345/691 |
| 2023/0169926 | A1 * | 6/2023 | Kim | G09G 3/3266 345/213 |

* cited by examiner

*Primary Examiner* — Nitin Patel
*Assistant Examiner* — Amen W Bogale
(74) *Attorney, Agent, or Firm* — Seed IP Law Group LLP

(57) ABSTRACT

Each gate stage of a gate driver may be implemented to operate based on a clock, a set signal, and a reset signal without a driving power, and thus, may not be connected to the driving power. Accordingly, because a driving power line is omitted, a mount area of the gate driver may be reduced, and thus, a narrow bezel may be easily implemented. Each gate stage may be implemented based on the clock without the driving power, and thus, a configuration thereof may be simplified. In this case, because each gate stage includes a leakage current blocker, even when the gate stage is manufactured based on an oxide transistor having a depletion characteristic, the operation stability thereof may be secured.

22 Claims, 21 Drawing Sheets

GATE DRIVER AND ELECTROLUMINESCENT DISPLAY APPARATUS INCLUDING THE SAME

CROSS-REFERENCE TO RELATED APPLICATIONS

This application claims the benefit of the Korean Patent Application No. 10-2021-0185479 filed on Dec. 22, 2021, which is hereby incorporated by reference as if fully set forth herein.

BACKGROUND

Technical Field

The present disclosure relates to a gate driver and an electroluminescent display apparatus including the same.

Description of the Related Art

Electroluminescent display apparatuses include a plurality of pixels arranged as a matrix type and supply pixels with image data synchronized with a scan signal, and thus, adjust the luminance of the pixels. The electroluminescent display apparatuses generate the scan signal by using a gate driver including a plurality of gate stages. Each of the gate stages of the gate driver is connected to a gate line of a display panel. Each gate stage includes a plurality of transistors and outputs the scan signal, swinging between a scan on voltage and a scan off voltage, to the gate line of the display panel.

BRIEF SUMMARY

Inventors recognize that in electroluminescent display apparatuses, because the number of gate lines increases as a resolution increases in a display screen having a certain size, the number of gate stages increases in a high-resolution display apparatus. When the number of gate stages increases, an area of a bezel area including the gate stages may inevitably increase, and due to this, there is a limitation in reducing a bezel in electroluminescent display apparatuses.

The present disclosure may provide a gate driver and an electroluminescent display apparatus including the same, in which configurations of gate stages may be simplified, and thus, a narrow bezel may be implemented.

Moreover, the present disclosure may provide a gate driver and an electroluminescent display apparatus including the same, in which gate stages are simplified in configuration to operate based on a clock without a driving power and each of the gate stages includes a leakage current blocker, thereby increasing operation stability.

The technical benefits and other advantages and in accordance with the purpose of the disclosure will be shown by the example embodiments described herein. In an example, as embodied and broadly described herein, a gate driver includes a plurality of stages. Each of the plurality of stages includes first serially-connected transistors turned on based on a first clock having an on level in a first period to apply a set signal having an on level to a first control node, a pull-up transistor turned on based on a voltage of the first control node bootstrapped from the on level in a second period succeeding the first period to apply a second clock, which is later in on-level phase than the first clock, to an output node, second serially-connected transistors turned on based on a reset signal having an on level and a voltage of a second node in a later fourth period than the second period to apply a second clock having an off level to the first control node, and a leakage current blocker blocking a leakage current of the first serially-connected transistors and the second serially-connected transistors based on a second clock having an on level and a third clock having an on level in the second period and a third period where the first control node is floated, the third period being arranged between the second period and the fourth period.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
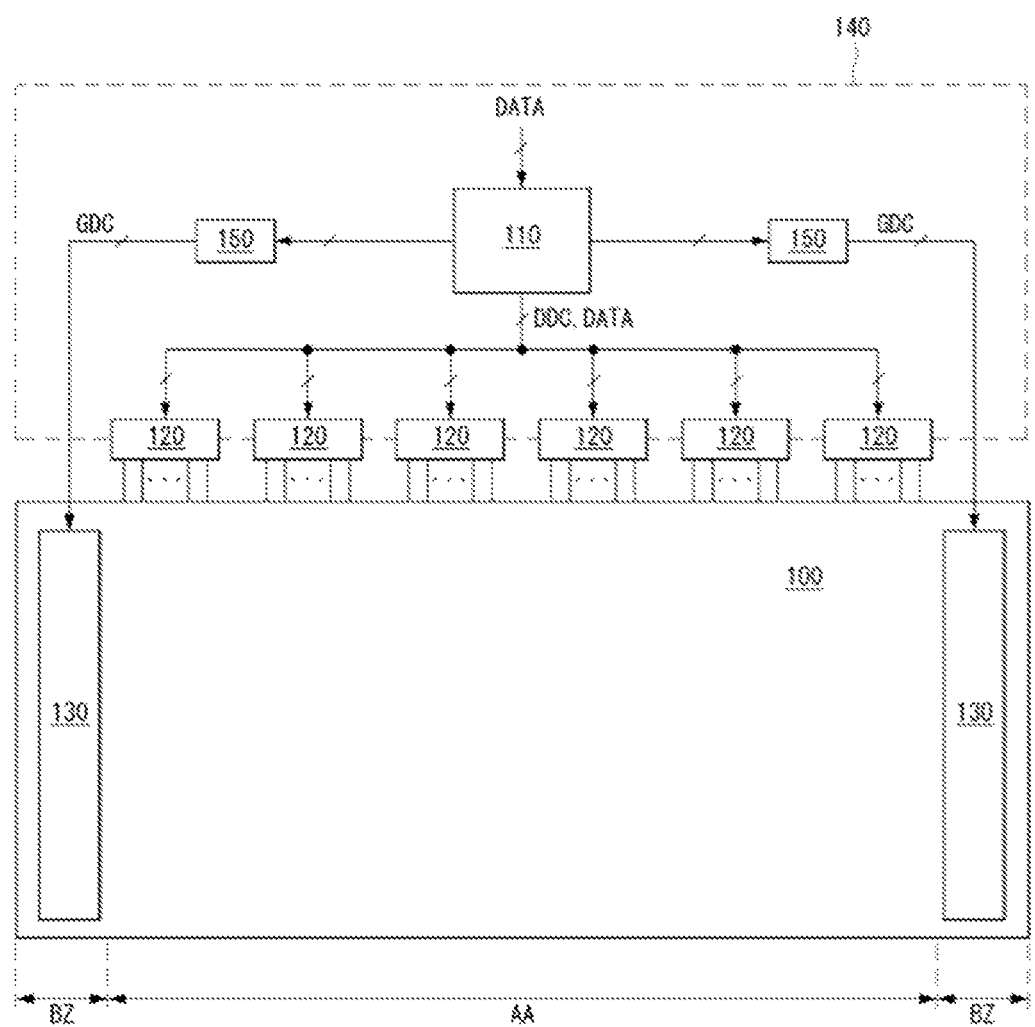
FIG. 1 is a diagram illustrating an electroluminescent display apparatus according to an embodiment of the present disclosure.

Hereinafter, the present disclosure will be described more fully with reference to the accompanying drawings, in which example embodiments of the disclosure are shown. The disclosure may, however, be embodied in many different forms and should not be construed as being limited to the embodiments set forth herein; rather, these embodiments are provided so that this disclosure will be thorough and complete, and will fully convey the concept of the disclosure to those skilled in the art.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

The shapes, sizes, ratios, angles, numbers and the like disclosed in the drawings for description of various embodiments of the present disclosure to describe embodiments of the present disclosure are merely example and the present disclosure is not limited thereto. Like reference numerals refer to like elements throughout. Throughout this specification, the same elements are denoted by the same reference numerals. As used herein, the terms "comprise," "having," "including" and the like suggest that other parts can be added unless the term "only" is used. As used herein, the singular forms "a," "an," and "the" are intended to include the plural forms as well, unless context clearly indicates otherwise.

Elements in various embodiments of the present disclosure are to be interpreted as including margins of error even without explicit statements.

In describing a position relationship, for example, when a position relation between two parts is described as "on~," "over~," "under~," and "next~," one or more other parts may be disposed between the two parts unless "just" or "direct" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In the present disclosure, a pixel circuit and a gate driver provided on a substrate of a display panel may be implemented with a transistor having an N metal oxide semiconductor field effect transistor (MOSFET) type, but are not limited thereto. A transistor may be a three-electrode element which includes a gate, a source, and a drain. The source may be an electrode which supplies a carrier to a transistor. In the transistor, a carrier may start to flow from the source. The drain may be an electrode which enables the carrier to flow out from the transistor. That is, in a MOSFET, the carrier flows from the source to the drain. In N MOS, because a carrier is a hole, a drain voltage may be higher than a source voltage so that the hole flows from the source to the drain. In N MOS, because the hole flows from the drain to the source, a current may flow from the drain to the source. It should be noted that a source and a drain of a MOSFET are not fixed. For example, the source and the drain of the MOSFET may switch therebetween. Therefore, in describing an embodiment of the present disclosure, one of a source and a drain may be described as a first electrode, and the other of the source and the drain may be described as a second electrode. The description of the operations or switching of the transistors herein may be based on a certain type of transistors, e.g., N MOS, although similar operations may be implemented using other types of transistors, e.g., P MOS or bipolar junction transistors, which are all included in the scope of the disclosure.

Hereinafter, embodiments of the present disclosure will be described in detail with reference to the accompanying drawings. In the following description, in an electroluminescent display apparatus, an organic light emitting display apparatus including an organic light emitting material will be mainly described. However, it should be noted that the inventive concept is not limited to the organic light emitting display apparatus and may be applied to an inorganic light emitting display apparatus including an inorganic light emitting material.

Figure 2:
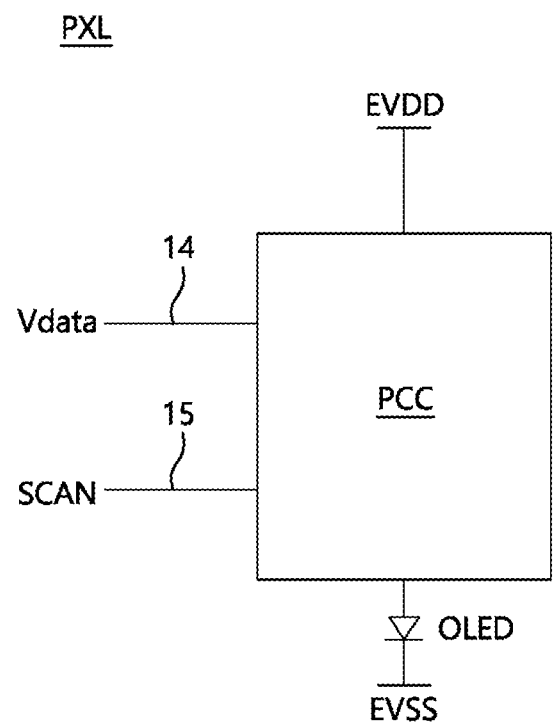
FIG. 2 is a diagram schematically illustrating an equivalent circuit of a pixel provided in a display panel of FIG. 1.

FIG. 1 is a diagram illustrating an electroluminescent display apparatus according to an embodiment of the present disclosure. FIG. 2 is a diagram schematically illustrating an equivalent circuit of a pixel provided in a display panel of FIG. 1.

Referring to FIG. 1, the display apparatus according to the present disclosure may include a display panel 100, a timing controller 110, a data driver 120, a gate driver 130, and a level shifter 150.

In the display panel 100, as in FIG. 2, pixels PXL connected to a data line 14 and a gate line 15 may be arranged as a matrix type to configure a pixel array. A plurality of horizontal pixel lines may be included in the pixel array, and a plurality of pixels PXL which are horizontally adjacent to one another and are connected to the gate line 15 in common may be arranged in the plurality of pixels PXL. Here, a horizontal pixel line may denote a set of pixels of one horizontal line implemented by pixels PXL horizontally adjacent to one another, instead of a physical signal line. The pixel array may include a power line which transfers a high level source voltage EVDD to the pixels PXL. Also, the pixel PXL may be further connected to a low level source voltage EVSS.

Each of the pixels PXL, as in FIG. 2, may include a light emitting device OLED and a pixel driving circuit PCC for driving the light emitting device OLED. The pixel driving circuit PCC may include a driving element which generates a driving current which is to be applied to the light emitting device OLED and a switch circuit connected to the driving element. The switch circuit may set and maintain a gate-source voltage of the driving element. To this end, the switch circuit may be supplied with a data voltage Vdata through the data line 14, supplied with a scan signal SCAN through the gate line 15, and supplied with the high level source voltage EVDD through a power line, thereby setting the gate-source voltage of the driving element. A gate electrode of a switch element included in the switch circuit may be connected to the gate line 15, and a first electrode (or a second electrode) of the switch element included in the switch circuit may be connected to a data line.

Each of the pixel PXL may be one of a red pixel, a green pixel, a blue pixel, and a white pixel. The red pixel, the green pixel, the blue pixel, and the white pixel may configure one unit pixel and may implement various colors. A color implemented in a unit pixel may be determined an emission rate of each of the red pixel, the green pixel, the blue pixel, and the white pixel. Furthermore, the white pixel may be omitted, and in this case, the unit pixel may be configured with the red pixel, the green pixel, and the blue pixel. Also, the number of gate lines 15 connected to the pixel PXL may be singular or plural.

Referring to FIG. 1, the data driver 120 may receive image data DATA and a source timing control signal DDC from the timing controller 110. In response to the source timing control signal DDC from the timing controller 110, the data driver 120 may convert the image data DATA into a gamma compensation voltage to generate a data voltage Vdata and may supply the data voltage Vdata to the data lines 14 of the display panel 100 on the basis of a supply timing of the scan signal SCAN. The data driver 120 may be connected to the data lines 14 of the display panel 100 through a chip on glass (COG) process or a tape automated bonding (TAB) process. The data driver 120 may be divided into a plurality of data drivers and provided, but is not limited thereto and may be provided as one.

Referring to FIG. 1, the level shifter 150 may generate a gate timing control signal GDC for driving a switch element of a pixel on the basis of an on/off control clock having a transistor-transistor-logic (TTL) level, which is input from the timing controller 110. The gate timing control signal GDC may include a start signal and a clock signal, which swing between an on level, e.g., a first logic level for turn on a transistor, and an off level, e.g., a second logic level for turn off a transistor. The level shifter 150 may supply the gate timing control signal GDC to the gate driver 130.

Referring to FIGS. 1 and 2, the gate driver 130 may operate based on the gate timing control signal GDC input from the level shifter 150 to generate the scan signal SCAN needed for driving of the pixel PXL. Also, the gate driver 130 may supply the scan signal SCAN to the gate lines 15.

The gate driver 130 may be directly provided on a lower substrate of the display panel 100 by using a gate driver in panel (GIP) type. The gate driver 130 may be provided in a non-display area (i.e., a bezel area BZ) outside a screen in the display panel 100. In the GIP type, the level shifter 150 may be mounted on a printed circuit board (PCB) 140 along with the timing controller 110.

In the gate driver 130, a plurality of gate stages may be connected to one another based on a cascading scheme to configure a gate shift register. A first gate stage of the plurality of gate stages may start to operate based on a start signal. Also, each of the other gate stages except the first gate stage may start to operate based on an output (i.e., a carry signal) of a previous gate stage which has operated prior thereto.

Each gate stage may be implemented to operate based on a clock, a set signal, and a reset signal without a driving power, and thus, may not be connected to the driving power. Accordingly, because a driving power line is omitted, a mount area of the gate driver 130 may be reduced, and thus, a narrow bezel may be easily implemented.

Each gate stage may be implemented based on the clock without the driving power, and thus, a configuration thereof may be simplified. In this case, because each gate stage includes a leakage current blocker, even when the gate stage is manufactured based on an oxide transistor having a depletion characteristic, the operation stability thereof may be secured. The depletion characteristic of the oxide transistor may denote a phenomenon where a threshold voltage of the oxide transistor is gradually reduced from an initial value by peripheral light. When the threshold voltage of the oxide transistor is lower than a gate-source voltage of 0 V for off, the oxide transistor may not be sufficiently turned off, and a leakage current may occur in the oxide transistor. When a plurality of transistors connected to a first control node (hereinafter, node Q) are in an off state, the leakage current blocker included in each gate stage may apply the clock having a sufficiently high on level to a source electrode of each of the plurality of transistors, and thus, a gate-source voltage of each of the plurality of transistors may be sufficiently lower than a threshold voltage thereof. Therefore, the leakage current blocker may prevent a leakage current through the plurality of transistors while the node Q is being floated in an on voltage state. An on voltage charged into the node Q may be stably maintained by the leakage current blocker, thereby preventing distortion of the scan signal caused by a voltage variation of the node Q.

The gate driver 130 may be disposed in both bezel areas BZ in the display panel 100 and may supply the scan signal to each gate line on the basis of a double feeding scheme, thereby minimizing signal distortion caused by a load deviation of each gate line.

Referring to FIG. 1, the timing controller 110 may be connected to an external host system by various interface types known to those skilled in the art. The timing controller 110 may receive video data DATA from the host system, correct the video data DATA to compensate for a luminance deviation caused by an electrical characteristic difference, and transfer the corrected video data to the data driver 120.

The timing controller 110 may receive a timing signal such as a vertical synchronization signal Vsync, a horizontal synchronization signal Hsync, a data enable signal DE, and a main clock MCLK from the host system and may generate a control clock which is based on the source timing control signal DDC and the gate timing control signal GDC, on the basis of the timing signal.

Figure 3:
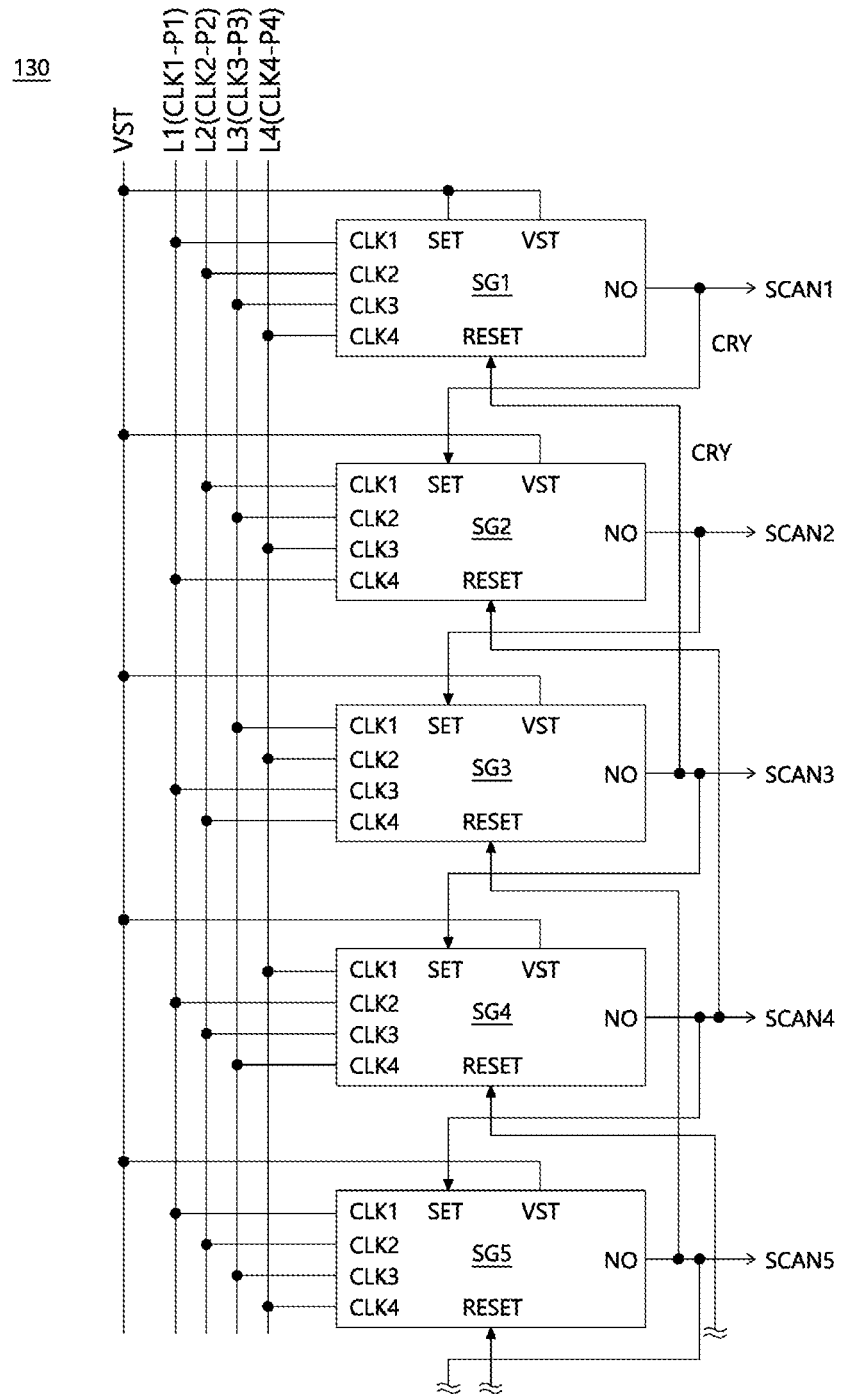
FIG. 3 is a diagram illustrating a first embodiment of a gate driver of FIG. 1.
Figure 4:
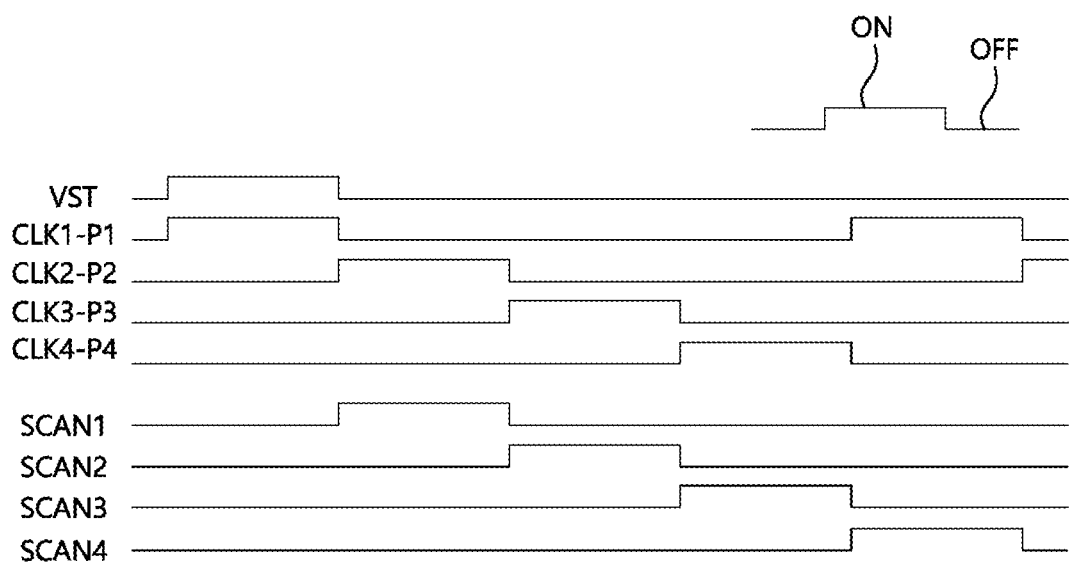
FIG. 4 is a diagram illustrating an example where a gate driver according to the first embodiment outputs a scan signal, based on a clock.

FIG. 3 is a diagram illustrating a first embodiment of the gate driver of FIG. 1. FIG. 4 is a diagram illustrating an example where a gate driver according to the first embodiment outputs a scan signal, based on a clock.

Referring to FIG. 3, a gate driver 130 according to the first embodiment of the present disclosure may include a plurality of gate stages SG1 to SG5 which are individually connected to gate lines.

Each of the gate stages SG1 to SG5 may include a first terminal to which a set signal SET is input, a second terminal to which a start signal VST is input, and a third terminal to which a reset signal RESET is input. Also, each of the gate stages SG1 to SG5 may include a first terminal to which a first clock CLK1 is input, a second terminal to which a second clock CLK2 is input, a third terminal to which a third clock CLK3 is input, and a fourth terminal to which a fourth clock CLK4 is input. Each of the gate stages SG1 to SG5 may not need a power input terminal, and thus, a configuration thereof may be simplified.

The gate stages SG1 to SG5 may be connected to one another based on the cascading scheme and may transfer and receive a carry signal CRY therebetween. The gate stages SG1 to SG5 may be connected to a start line through which the start signal VST is supplied and clock lines L1 to L4 through which first to fourth phase clocks CLK-P1 to CLK-P4 are supplied.

A first gate stage SG1 of the gate stages SG1 to SG5 may start to operate based on the start signal VST input to a first terminal thereof. A set signal SET of the first gate stage SG1 may be the start signal VST. Each of the other gate stages SG2 to SG5 except the first gate stage SG1 among the gate stages SG1 to SG5 may start to operate, e.g., a node Q may be activated at an ON level, based on a carry signal CRY input to a first terminal thereof from the previous stage, referred to as a previous carry signal CRY for descriptive purposes. A set signal SET of each of the other gate stages SG2 to SG5 may be a previous carry signal CRY from the previous stage. An operation of each of the gate stages SG1 to SG5 may be reset, e.g., the node Q may be deactivated at an OFF level, based on a carry signal CRY input to a third terminal thereof from a next stage, referred to as a next carry signal CRY for descriptive purposes. A reset signal RESET of each of the other gate stages SG1 to SG5 may be a next carry signal CRY from the previous stage. Here, with respect to an $n^{th}$ gate stage, a previous carry signal CRY may be a scan signal SCAN(n−1) of an (n−1)th gate stage, and a next carry signal CRY may be a scan signal SCAN(n+1) of an (n+1)th gate stage.

Each of the gate stages SG1 to SG5 may be connected to a gate line, a first terminal of a next gate stage, and a third terminal of a previous gate stage through an output node NO.

The first phase clock CLK-P1 may be supplied to a first clock line L1, the second phase clock CLK-P2 which is later in phase than the first phase clock CLK-P1 may be supplied to a second clock line L2, the third phase clock CLK-P3 which is later in phase than the second phase clock CLK-P2 may be supplied to a third clock line L3, and the fourth phase clock CLK-P4 which is later in phase than the third phase clock CLK-P3 may be supplied to a fourth clock line L4. On-level phases of the first to fourth phase clocks CLK-P1 to CLK-P4 may not overlap.

A $4K-3^{th}$ (where K is a natural number) gate stage may respectively receive the first phase clock CLK-P1, the second phase clock CLK-P2, the third phase clock CLK-P3, and the fourth phase clock CLK-P4 as the first clock CLK1, the second clock CLK2, the third clock CLK3, and the fourth clock CLK4.

A $4K-2^{th}$ gate stage may respectively receive the second phase clock CLK-P2, the third phase clock CLK-P3, the fourth phase clock CLK-P4, and the first phase clock CLK-P1 as the first clock CLK1, the second clock CLK2, the third clock CLK3, and the fourth clock CLK4.

A $4K-1^{th}$ gate stage may respectively receive the third phase clock CLK-P3, the fourth phase clock CLK-P4, the first phase clock CLK-P1, and the second phase clock CLK-P2 as the first clock CLK1, the second clock CLK2, the third clock CLK3, and the fourth clock CLK4.

Moreover, a $4K^{th}$ gate stage may respectively receive the fourth phase clock CLK-P4, the first phase clock CLK-P1, the second phase clock CLK-P2, and the third phase clock CLK-P3 as the first clock CLK1, the second clock CLK2, the third clock CLK3, and the fourth clock CLK4.

The gate stages SG1 to SG4 may output scan signals SCAN1 to SCAN4 which are shifted in phase as in FIG. 4, on the basis of a connection configuration described above. In FIG. 4, the start signal VST, the first to fourth phase clocks CLK-P1 to CLK-P4, and the scan signals SCAN1 to SCAN4 may swing between an ON level and an OFF level. In the example of FIG. 4 (and FIGS. 6, 9, 12, and 15), the ON level is a high logic level for switch on a respective transistor, and the OFF level is a low logic level for switch off a transistor or not sufficiently high to switch on a respective transistor. This example does not limit the scope of the transistor. In some implementations, depending on the types of transistors used, an on level may be a low level and an off level may be a high level. Each of the first to fourth phase clocks CLK-P1 to CLK-P4 may have a plurality of ON level periods in one frame. On the other hand, each of the start signal VST and the scan signals SCAN1 to SCAN4 may have one on level period in one frame. Particularly, the start signal VST may have an ON level to overlap a first on level period of the first phase clock CLK-P1 in one frame and may have an OFF level in the other periods.

Figure 5:
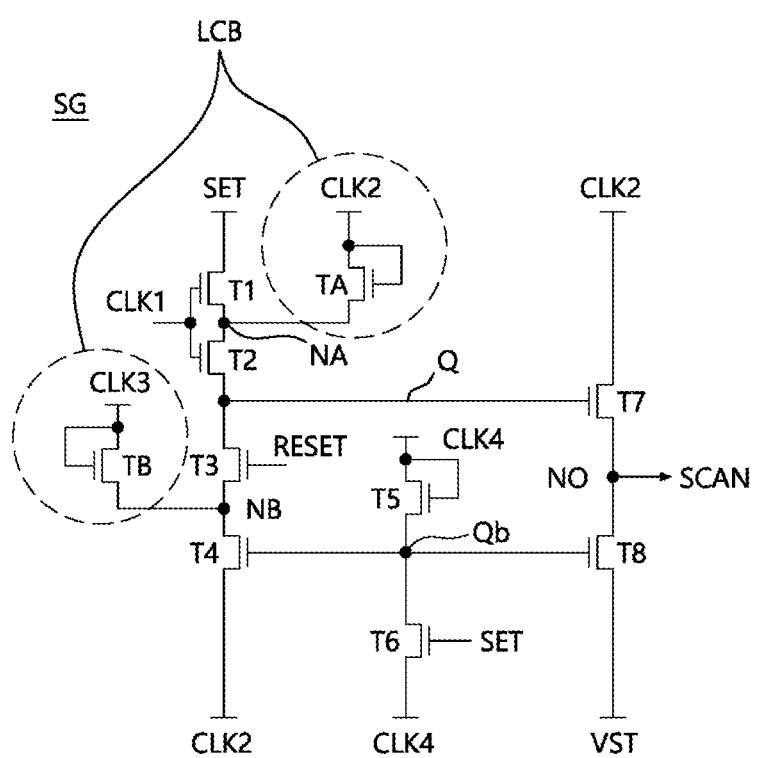
FIG. 5 is a diagram illustrating a circuit configuration of a gate stage included in the gate driver according to the first embodiment.
Figure 6:
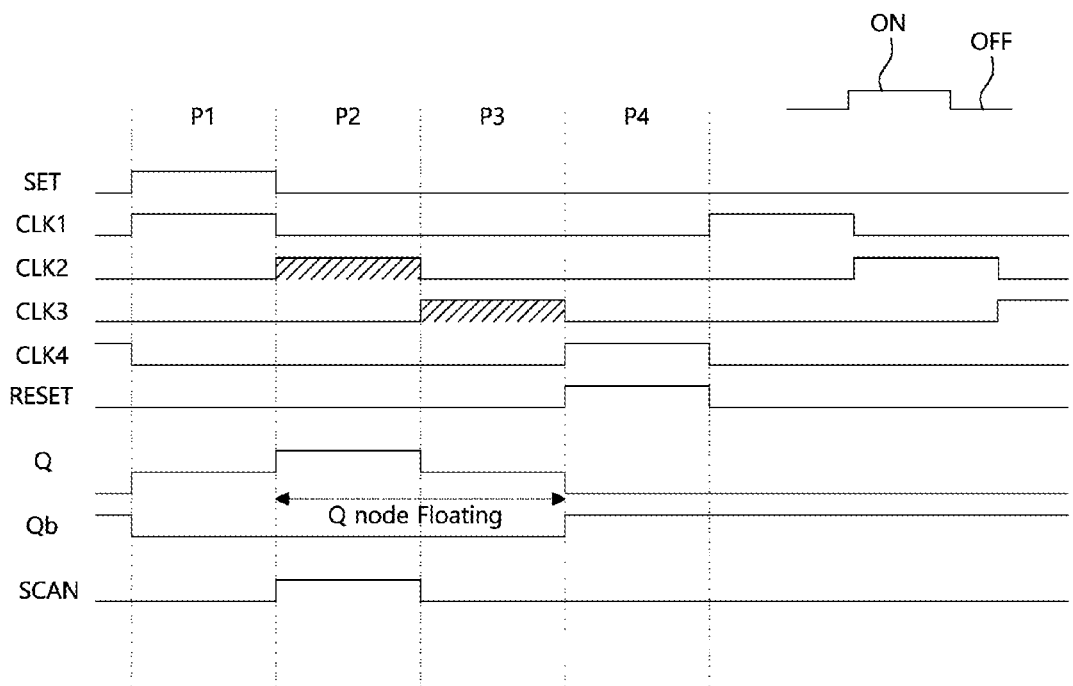
FIG. 6 is a diagram showing an operation waveform of the gate stage of FIG. 5.

FIG. 5 is a diagram illustrating a circuit configuration of a gate stage included in the gate driver according to the first embodiment. FIG. 6 is a diagram showing an operation waveform of the gate stage of FIG. 5.

Referring to FIGS. 5 and 6, a gate stage SG may operate based on first, second, third, and fourth clocks CLK1, CLK2, CLK3, and CLK4, a start signal VST, a set signal SET, and a reset signal RESET to output a scan signal SCAN to an output node NO. In some embodiments, the gate stage SG may receive the set signal SET and the first clock CLK1 having an ON level of a first phase, the second clock CLK2 having an ON level of a second phase which is later than the first phase, the third clock CLK3 having an ON level of a third phase which is later than the second phase, and the reset signal RESET and the fourth clock CLK4 having an ON level of a fourth phase which is later than the third phase and may output the scan signal SCAN having an ON level of the second phase to the output node NO. In this case, an on-level phase of the start signal VST may be earlier than or equal to the set signal SET.

The gate stage SG may include first serially-connected transistors T1 and T2 for applying the set signal SET having an ON level to a node Q on the basis of the first clock CLK1, second serially-connected transistors T3 and T4 for applying the second clock signal having an OFF level to the node Q on the basis of the reset signal RESET and a voltage of a second control node, hereinafter, node Qb, a fifth transistor T5 for applying the fourth clock CLK4 having an ON level to the node Qb, a sixth transistor T6 for applying the fourth clock CLK4 having an OFF level to the node Qb on the basis of the set signal SET, a pull-up transistor T7 for applying the second clock CLK2 to the output node NO on the basis of a voltage of the node Q, a pull-down transistor T8 for applying the start signal VST having an OFF level to the output node NO on the basis of a voltage of the node Qb, and a leakage current blocker LCB for blocking a leakage current of the first serially-connected transistors T1 and T2 and the second serially-connected transistors T3 and T4 in a period where the node Q is floated. Here, the first serially-connected transistors T1 and T2 may include a first transistor T1 and a second transistor T2 serially connected to each other, and the second serially-connected transistors T3 and T4 may include a third transistor T3 and a fourth transistor T4 serially connected to each other.

The leakage current blocker LCB may apply the second clock CLK2 having an ON level to a first node NA between the first serially-connected transistors T1 and T2 and may apply the third clock CLK3 having an ON level to a second node NB between the second serially-connected transistors T3 and T4 in a period where the node Q is floated, thereby preventing abnormal discharging of the node Q and distortion of a scan signal SCAN caused thereby. In this case, the second clock CLK2 having an ON level may not overlap the third clock CLK3 having an ON level, and thus, an effect where a reverse bias application period with respect to serially-connected transistors increases may be obtained. In some embodiments (for example, shown in the FIG. 9), based on a clock design, the second clock CLK2 having an ON level may partially overlap the third clock CLK3 having an ON level.

The leakage current blocker LCB may include a first blocking transistor TA which applies the second clock CLK2 having an ON level to a first node NA between the first transistor T1 and the second transistor T2 and a second blocking transistor TB which applies the third clock CLK3 having an ON level to a second node NB between the third transistor T3 and the fourth transistor T4. For example, the first blocking transistor TA is turned on when the second clock signal CLK2 is at the ON level, and the second blocking transistor TB is turned on when the third clock signal CLK3 is at the ON level.

In some embodiments, a gate electrode and a first electrode of the first blocking transistor TA may be connected to an input terminal for the second clock CLK2, and a second electrode of the first blocking transistor TA may be connected to the first node NA. A gate electrode and a first electrode of the second blocking transistor TB may be connected to an input terminal for the third clock CLK3, and a second electrode of the second blocking transistor TB may be connected to the second node NB.

The first clock CLK1 may have an OFF level in a period where the node Q is floated, and in this case, when the second clock CLK2 having an ON level is applied to the first node NA, a gate-source voltage of each of the first transistor T1 and the second transistor T2 may be a sufficient negative (−) voltage. Accordingly, even when a threshold voltage of each of the first transistor T1 and the second transistor T2 is shifted in a negative (−) direction by peripheral light, the first transistor T1 and the second transistor T2 may maintain an off state, and an abnormal leakage current may be prevented from occurring in the first transistor T1 and the second transistor T2.

Moreover, the reset signal RESET and a voltage of the node Qb may have an OFF level in a period where the node Q is floated, and in this case, when the third clock CLK3 having an ON level is applied to the second node NB, a gate-source voltage of each of the third transistor T3 and the fourth transistor T4 may be a sufficient negative (−) voltage. Accordingly, even when a threshold voltage of each of the third transistor T3 and the fourth transistor T4 is shifted in a negative (−) direction by peripheral light, the third transistor T3 and the fourth transistor T4 may maintain an off state, and an abnormal leakage current may be prevented from occurring in the third transistor T3 and the fourth transistor T4.

In some embodiments, a channel size of the first blocking transistor TA is less than a channel size of each of the first transistor T1 and the second transistor T2, and a channel size of the second blocking transistor TB is less than a channel size of each of the third transistor T3 and the fourth transistor T4. Furthermore, for the stability of an operation and a narrow formation area of a gate stage, it may be configured that a channel size of each of the first and second blocking transistors TA and TB is less than that of each of the first, second, third, fourth, fifth and sixth transistors T1, T2, T3, T4, T5, and T6. For example, it may be designed that a channel size of each of the first and second blocking transistors TA and TB is 1/10 to 1/5 times a channel size of each of the first, second, third, fourth, fifth and sixth transistors T1, T2, T3, T4, T5, and T6. Also, in order to improve an output response characteristic of a scan signal, it may be configured that a channel size of each of the pull-up transistor T7 and the pull-down transistor T8 is greater than that of each of the first, second, third, fourth, fifth and sixth transistors T1, T2, T3, T4, T5, and T6. For example, it may be designed that a channel size of each of the pull-up transistor T7 and the pull-down transistor T8 is 10 times a channel size of each of the first, second, third, fourth, fifth and sixth transistors T1, T2, T3, T4, T5, and T6.

Figure 7A:
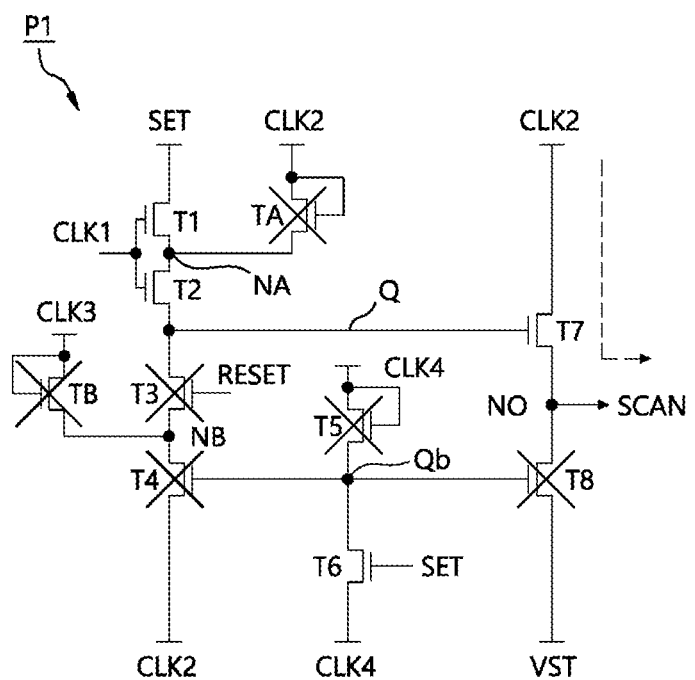
FIG. 7A is a diagram illustrating an operating state of the gate stage in a first period of FIG. 6.
Figure 7B:
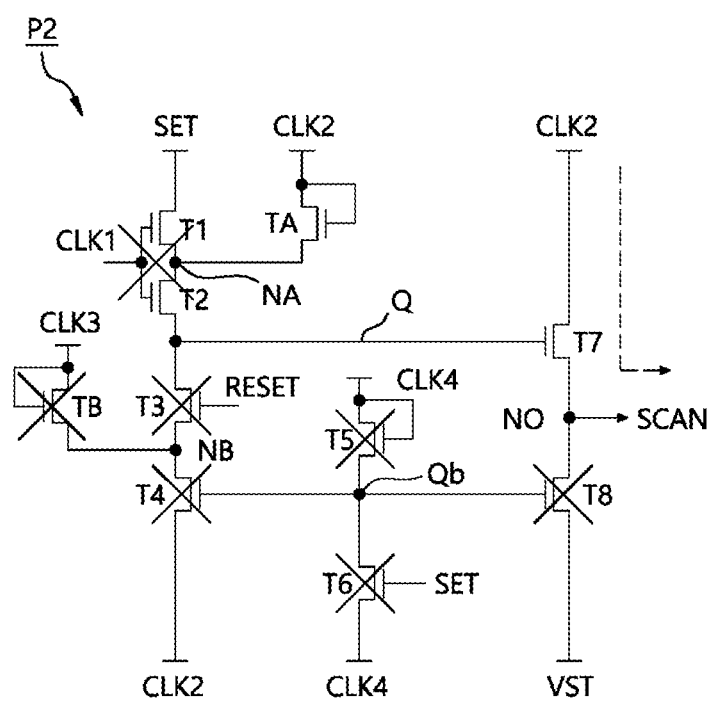
FIG. 7B is a diagram illustrating an operating state of the gate stage in a second period of FIG. 6.
Figure 7C:
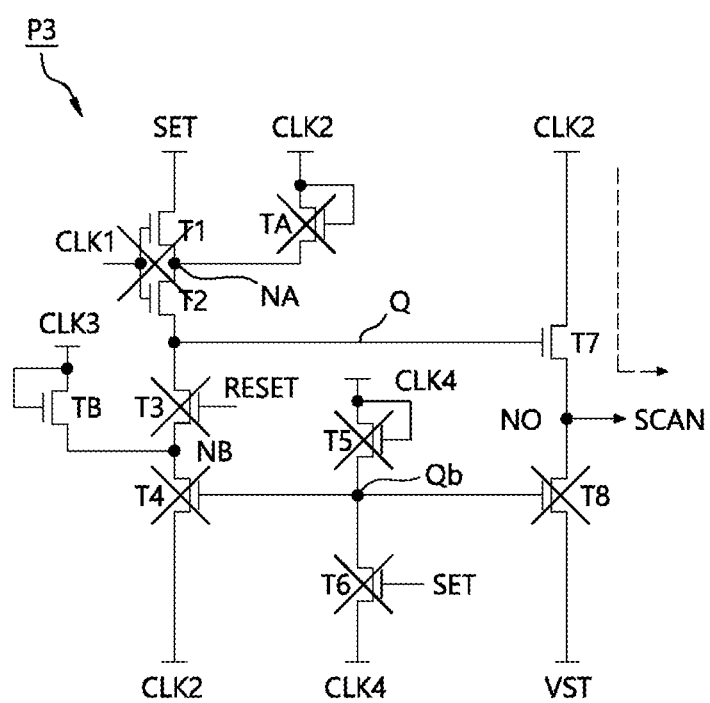
FIG. 7C is a diagram illustrating an operating state of the gate stage in a third period of FIG. 6.
Figure 7D:
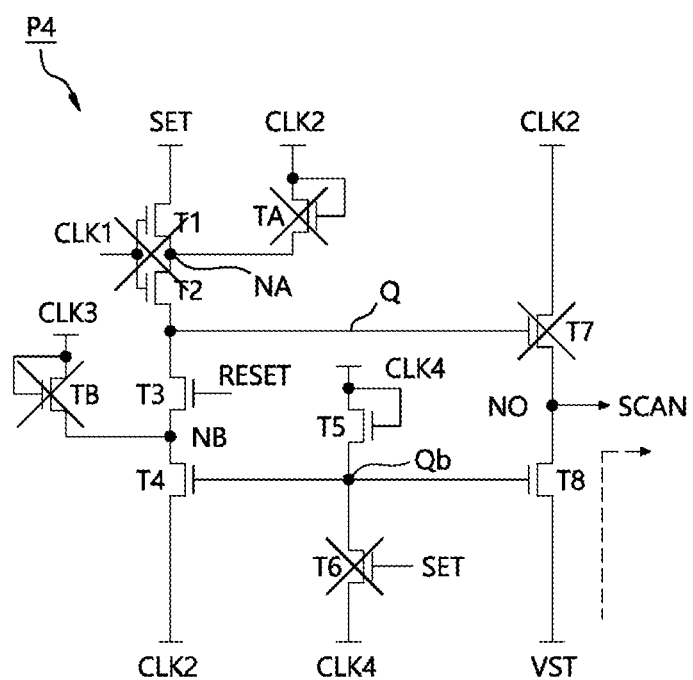
FIG. 7D is a diagram illustrating an operating state of the gate stage in a fourth period of FIG. 6.

FIG. 7A is a diagram illustrating an operating state of the gate stage in a first period of FIG. 6. FIG. 7B is a diagram illustrating an operating state of the gate stage in a second period of FIG. 6. FIG. 7C is a diagram illustrating an operating state of the gate stage in a third period of FIG. 6. FIG. 7D is a diagram illustrating an operating state of the gate stage in a fourth period of FIG. 6.

A configuration and an operation of a gate stage SG will be additionally described with reference to FIGS. 7A to 7D in conjunction with FIG. 6.

Referring to FIGS. 6 and 7A, the first serially-connected transistors T1 and T2 may be turned on based on the first clock CLK1 having an ON level in a first period P1 and may apply the set signal SET having an ON level to the node Q. The first clock CLK1 and the set signal SET may have an ON level in the first period P1. The sixth transistor T6 may be turned on based on the set signal SET having an ON level in the first period P1 and may apply the fourth clock CLK4 having an OFF level to the node Qb.

Referring to FIGS. 6 and 7B, the pull-up transistor T7 may be turned on based on a voltage of the node Q bootstrapped from an ON level in a second period P2 succeeding the first period P1 and may apply the second clock CLK2, which is later in on-level phase than the first clock CLK1, to the output node NO. The second clock CLK2 may have an ON level in the second period P2. In the second period P2, the output node NO may output the scan signal SCAN having an ON level based on the second clock CLK2.

Referring to FIGS. 6 and 7C, a third period P3 may be arranged between the second period P2 and the fourth period P4. In the second period P2 and the third period P3, because the first serially-connected transistors T1 and T2 and the second serially-connected transistors T3 and T4 are turned off, the node Q may be floated. In the second period P2 and the third period P3 where the node Q is floated, the leakage current blocker LCB may block a leakage current through the first serially-connected transistors T1 and T2 and the second serially-connected transistors T3 and T4 on the basis of the second clock CLK2 having an ON level and the third clock CLK3 having an ON level.

Referring to FIGS. 6 and 7D, each of the second serially-connected transistors T3 and T4 may be turned on based on the reset signal RESET having an ON level and a voltage of the node Qb in the fourth period P4 and may apply the second clock CLK2 having an OFF level to the node Q. The reset signal RESET and the voltage of the node Qb may have an ON level in the fourth period P4.

In the fourth period P4, the fifth transistor T5 may apply the fourth clock CLK4 having an ON level to the node Qb in the fourth period P4, and the fourth clock CLK4 having an ON level may be later in phase than the third clock CLK3 having an ON level.

The pull-down transistor T8 may be turned on with a voltage of the node Qb based on the fourth clock CLK4 having an ON level and may apply the start signal VST having an OFF level to the output node NO. The start signal VST may maintain an ON level during only a certain period in one frame and may maintain an OFF level during the other period of the one frame, and the certain period may be a first ON level period of the first clock CLK1 or may be earlier than the first ON level period of the first clock CLK1.

Figure 8:
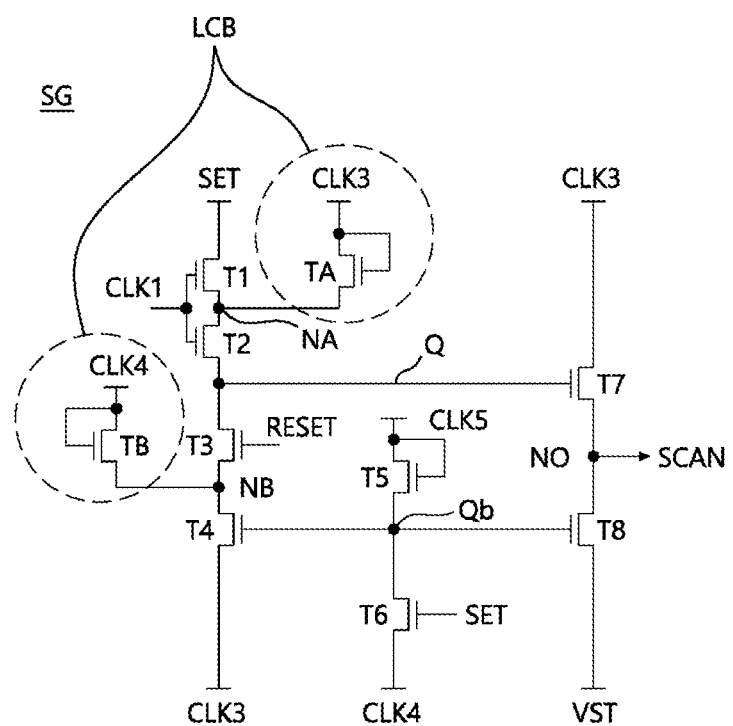
FIG. 8 is a diagram illustrating another circuit configuration of a gate stage included in the gate driver according to the first embodiment.
Figure 9:
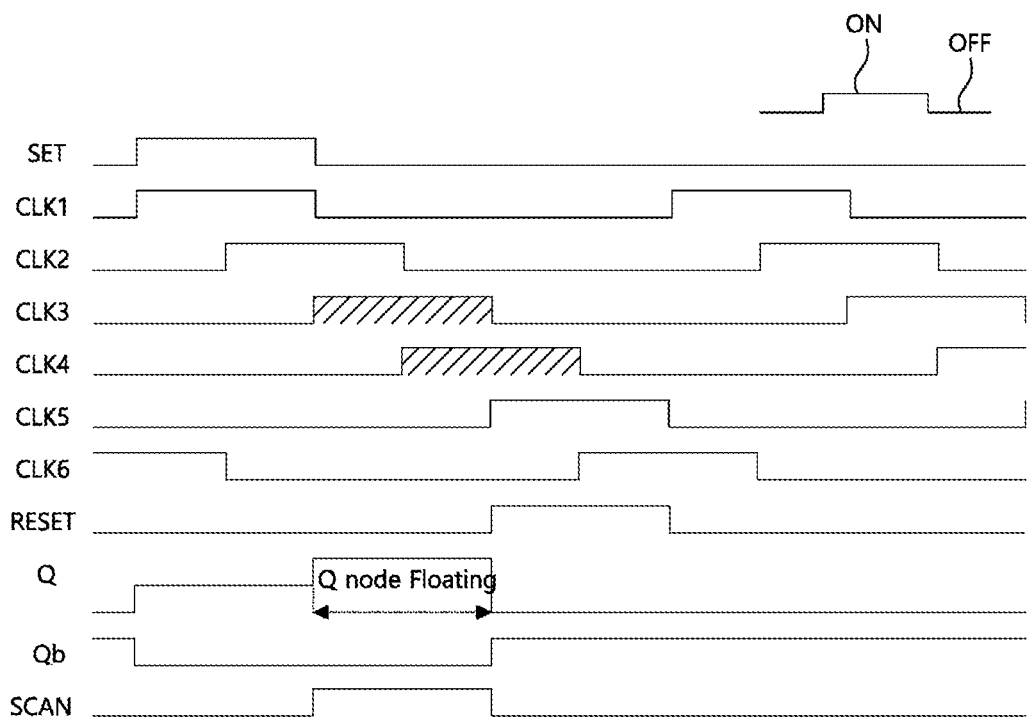
FIG. 9 is a diagram showing an operation waveform of the gate stage of FIG. 8.

FIG. 8 is a diagram illustrating another circuit configuration of a gate stage included in the gate driver according to the first embodiment. FIG. 9 is a diagram showing an operation waveform of the gate stage of FIG. 8.

Referring to FIGS. 8 and 9, a gate stage SG may operate based on first to sixth phase clocks where on-level phases of adjacent phase clocks overlap partially. The gate stage SG may respectively receive a first phase clock CLK-P1, a third phase clock CLK-P3, a fourth phase clock CLK-P4, and a fifth phase clock CLK-P5 as a first clock CLK1, a third clock CLK3, a fourth clock CLK4, and a fifth clock CLK5.

Comparing with the gate stage SG of FIG. 5, the gate stage SG of FIG. 8 may have a difference in that the third clock CLK3 is applied to a transistor TA, the third clock CLK3 is applied to a transistor T7, the fourth clock CLK4 is applied to a transistor TB, the third clock CLK3 is applied to a transistor T4, and the fifth clock CLK5 is applied to a transistor T5, but the other elements may be substantially the same. In a period where a node Q is floated, a leakage current blocker LCB included in the gate stage SG of FIG. 8 may apply the third clock CLK3 having an ON level to a first node NA between first serially-connected transistors T1 and T2 and may apply the fourth clock CLK4 having an ON level to a second node NB between second serially-connected transistors T3 and T4, thereby preventing abnormal discharging of the node Q and distortion of a scan signal SCAN caused thereby.

Figure 10:
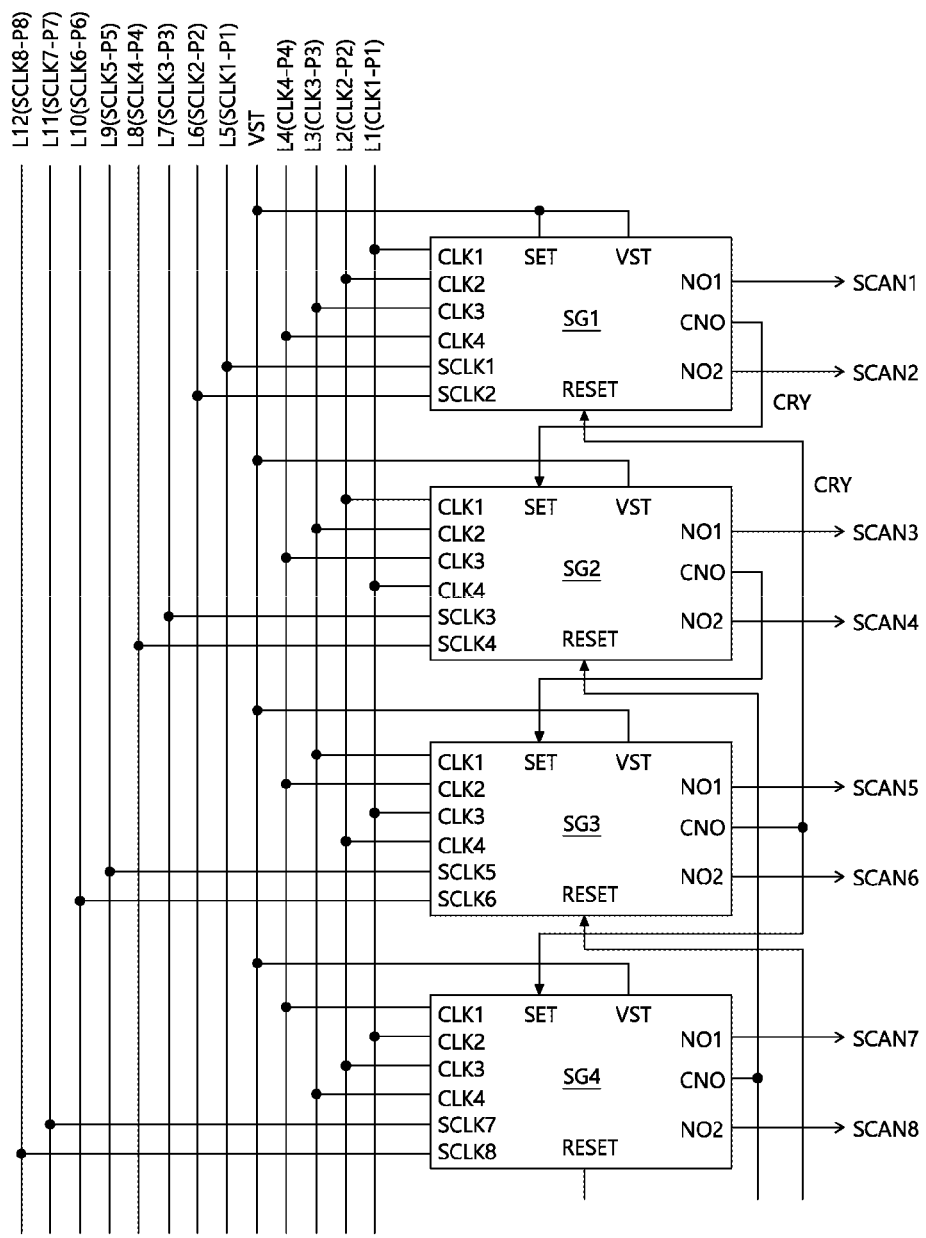
FIG. 10 is a diagram illustrating a second embodiment of the gate driver of FIG. 1.

FIG. 10 is a diagram illustrating a second embodiment of the gate driver of FIG. 1.

Referring to FIG. 10, a gate driver 130 according to the second embodiment of the present disclosure may include a plurality of gate stages SG1, SG2, SG3, SG4 which are individually connected to gate line pairs.

Each of the gate stages SG1, SG2, SG3, SG4 may generate two scan signals having different phases, supply a first scan signal to a first gate line included in a gate line pair, and supply a second scan signal to a second gate line included in the gate line pair.

Each of the gate stages SG1, SG2, SG3, SG4 may include a first additional output node NO1 through which the first scan signal is output and a second additional output node NO2 through which the second scan signal is output. Because an carry output node CNO through which a carry signal CRY is output is divided into the first additional output node NO1 and the second additional output node NO2, the carry signal CRY may be prevented from being distorted by a panel load.

Each of the gate stages SG1, SG2, SG3, SG4 may include a first terminal to which a set signal SET is input, a second terminal to which a start signal VST is input, and a third terminal to which a reset signal RESET is input. Also, each of the gate stages SG1, SG2, SG3, SG4 may include a first clock terminal to which a first clock CLK1 is input, a second terminal to which a second clock CLK2 is input, a third clock terminal to which a third clock CLK3 is input, and a fourth clock terminal to which a fourth clock CLK4 is input. The second clock CLK2 may perform a function of an output of the carry signal CRY, and moreover, may not perform a function of outputs of the first and second scan signals. Each of the gate stages SG1, SG2, SG3, SG4 may further receive two scan clocks 1 and 2 (in the example of SG1) for outputs of the first and second scan signals through the first additional output node NO1 and the second additional output node NO2. While the node Q is being activated, the carry signal CRY and the first scan signal may be respectively output to an output node and a first additional output node, and subsequently, the second scan signal may be output to a second additional output node. Each of the gate stages SG1, SG2, SG3, SG4 may not need a power input terminal, and thus, a configuration thereof may be simplified.

The gate stages SG1, SG2, SG3, SG4 may be connected to one another based on the cascading scheme and may transfer and receive the carry signal CRY therebetween. The gate stages SG1, SG2, SG3, SG4 may be connected to a start line through which the start signal VST is supplied, clock lines L1, L2, L3, L4 through which first to fourth phase clocks CLK-P1, CLK-P2, CLK-P3, and CLK-P4 are supplied, and additional clock lines L5, L6, L7, L8, L9, L10, L11, and L12 through which first to eighth phase scan clocks SCLK-P1, SCLK-P2, SCLK-P3, SCLK-P4, SCLK-P5, SCLK-P6, SCLK-P7, and SCLK-P8 are supplied.

A first gate stage SG1 of the gate stages SG1 to SG4 may start to operate based on the start signal VST input to a first terminal thereof. A set signal SET of the first gate stage SG1 may be the start signal VST. Each of the other gate stages SG2 to SG4 except the first gate stage SG1 among the gate stages SG1 to SG4 may start to operate, e.g., a node Q may be activated at an ON level, based on a previous carry signal CRY input to a first terminal thereof. A set signal SET of each of the other gate stages SG2 to SG4 may be a previous carry signal CRY. An operation of each of the gate stages SG1 to SG4 may be reset, e.g., the node Q may be deactivated at an OFF level, based on a next carry signal CRY input to a third terminal thereof. A reset signal RESET of each of the other gate stages SG1 to SG4 may be a next carry signal CRY. Here, with respect to an nth gate stage, a previous carry signal CRY may be output from an $(n-1)^{th}$ gate stage, and a next carry signal CRY may be output from an (n+2)th gate stage.

Each of the gate stages SG1 to SG4 may be connected to a first terminal of a next gate stage through the carry output node CNO, connected to a first gate line included in a gate line pair through the first additional output node NO1, and connected to a second gate line included in the gate line pair through the second additional output node NO2.

The first phase clock CLK-P1 may be supplied to a first clock line L1, the second phase clock CLK-P2 which is later in phase than the first phase clock CLK-P1 may be supplied to a second clock line L2, the third phase clock CLK-P3 which is later in phase than the second phase clock CLK-P2 may be supplied to a third clock line L3, and the fourth phase clock CLK-P4 which is later in phase than the third phase clock CLK-P3 may be supplied to a fourth clock line L4. On-level phases of the first to fourth phase clocks CLK-P1 to CLK-P4 may not overlap. In some embodiments, on-level phases of adjacent phase scan clocks among first to eighth phase scan clocks SCLK-P1 to SCLK-P8 may overlap. Each of the first to eighth phase scan clocks SCLK-P1 to SCLK-P8 may be sequentially applied to two adjacent gate stages on the basis of a phase progressive scheme.

A $(4K-3)^{th}$ (where K is a natural number) gate stage may respectively receive the first phase clock CLK-P1, the second phase clock CLK-P2, the third phase clock CLK-P3, and the fourth phase clock CLK-P4 as the first clock CLK1, the second clock CLK2, the third clock CLK3, and the fourth clock CLK4. The $(4K-3)^{th}$ gate stage may respectively receive the first phase scan clock SCLK-P1 and the second phase scan clocks SCLK-P2 as the scan clock 1 and the scan clock 2.

A $(4K-2)^{th}$ gate stage may respectively receive the second phase clock CLK-P2, the third phase clock CLK-P3, fourth phase clock CLK-P4, and the first phase clock CLK-P1 as the first clock CLK1, the second clock CLK2, the third clock CLK3, and the fourth clock CLK4. The $(4K-2)^{th}$ gate stage may respectively receive the third phase scan clock SCLK-P3 and the fourth phase scan clocks SCLK-P4 as the scan clock 1 and the scan clock 2.

A (4K−1)$^{th}$ gate stage may respectively receive the third phase clock CLK-P3, the fourth phase clock CLK-P4, the first phase clock CLK-P1, and the second phase clock CLK-P2 as the first clock CLK1, the second clock CLK2, the third clock CLK3, and the fourth clock CLK4. The 4K−1$^{th}$ gate stage may respectively receive the fifth phase scan clock SCLK-P5 and the sixth phase scan clocks SCLK-P6 as the scan clock 1 and the scan clock 2.

Moreover, a (4K)$^{th}$ gate stage may respectively receive the fourth phase clock CLK-P4, the first phase clock CLK-P1, the second phase clock CLK-P2, and the third phase clock CLK-P3 as the first clock CLK1, the second clock CLK2, the third clock CLK3, and the fourth clock CLK4. The (4K)$^{th}$ gate stage may respectively receive the seventh phase scan clock SCLK-P7 and the eighth phase scan clocks SCLK-P8 as the scan clock 1 and the scan clock 2.

Each of the gate stages SG1 to SG4 may output the first scan signal and the second scan signal separated from the carry signal CRY on the basis of a connection configuration described above. Because each gate stage outputs two scan signals by using one node Q and one node Qb, and thus, the number of stages may decrease by half of the number of gate lines, and thus, an area, occupied by the gate driver 120, of a bezel area may be reduced.

Figure 11:
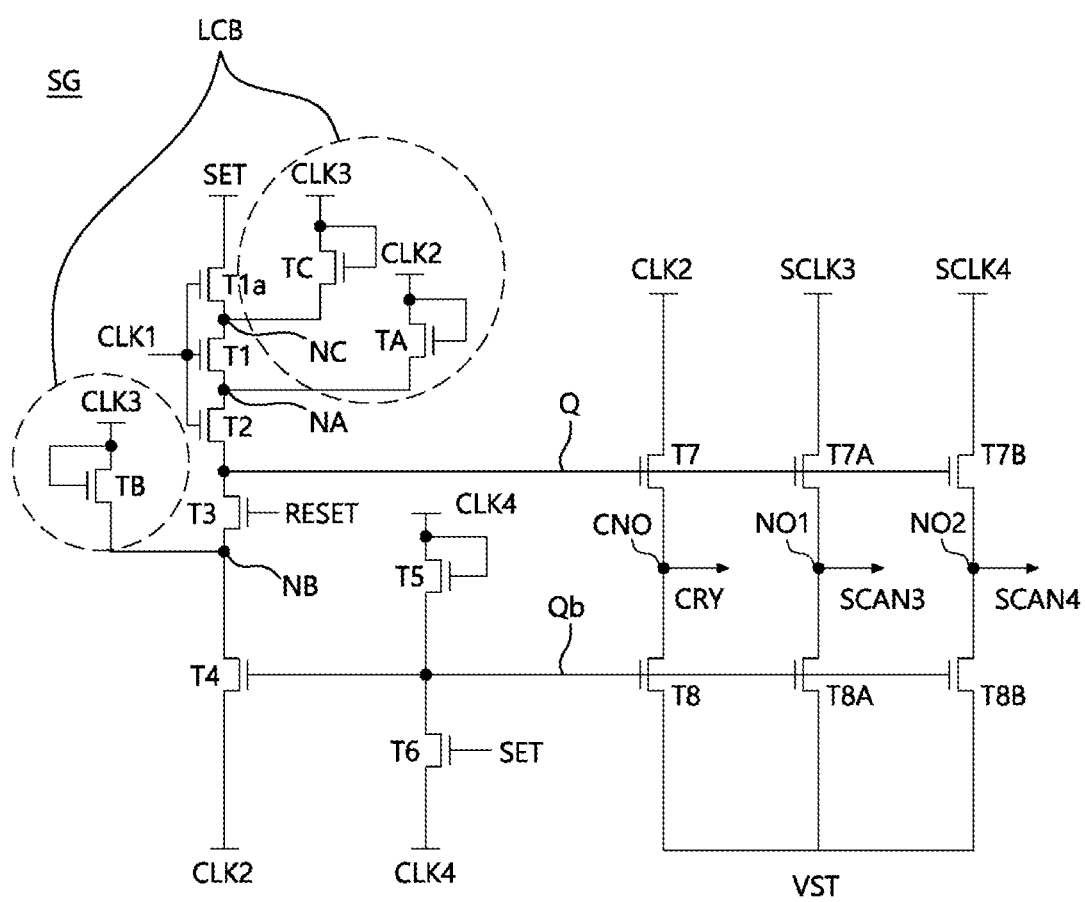
FIG. 11 is a diagram illustrating a circuit configuration of a gate stage included in the gate driver according to the second embodiment.
Figure 12:
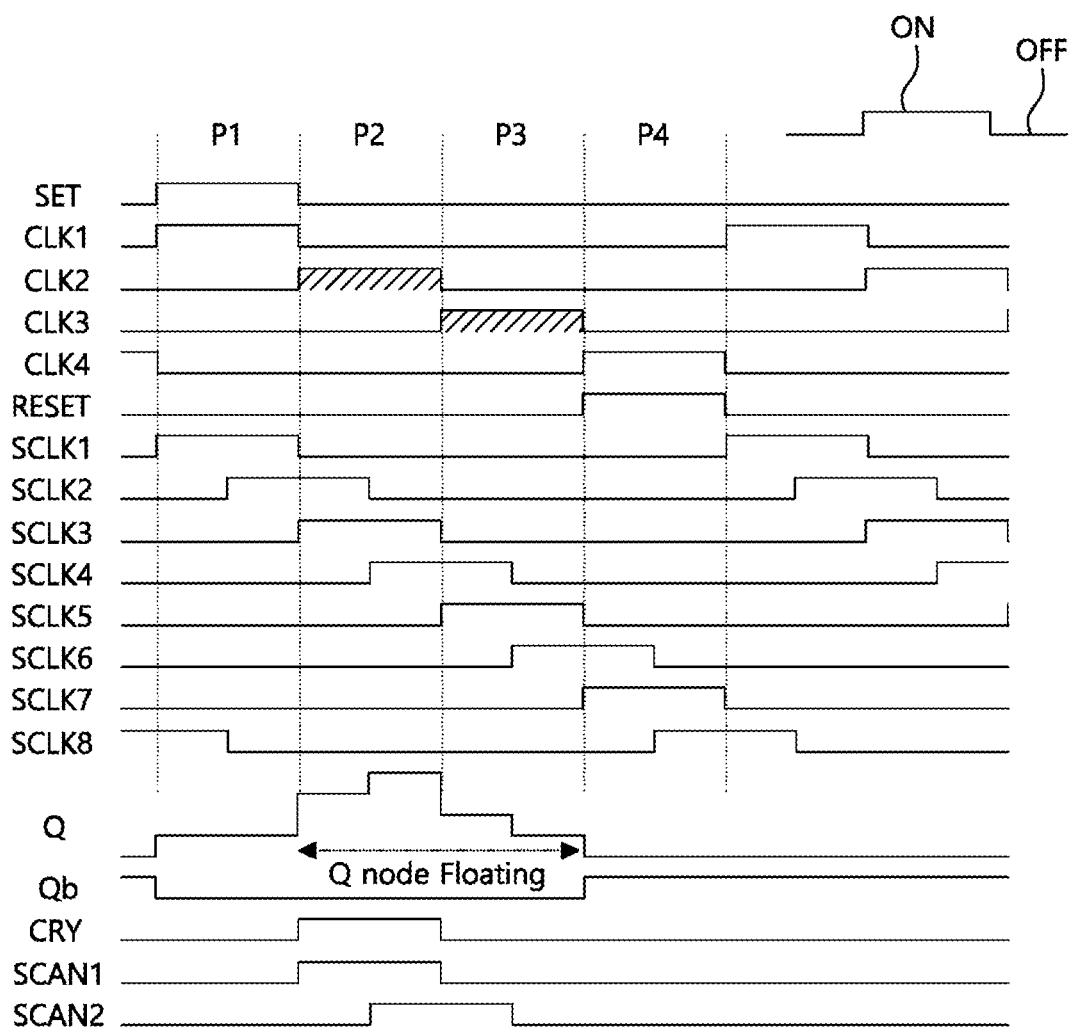
FIG. 12 is a diagram showing an operation waveform of the gate stage of FIG. 11.

FIG. 11 is a diagram illustrating a circuit configuration of a gate stage included in the gate driver according to the second embodiment. FIG. 12 is a diagram showing an operation waveform of the gate stage of FIG. 11.

Referring to FIGS. 11 and 12, a gate stage SG may operate based on first to fourth clocks CLK1 to CLK4, a scan clock 1 SCLK3, a scan clock 2 SCLK4, a start signal VST, a set signal SET, and a reset signal RESET to output a carry signal CRY to an carry output node CNO, a scan signal 1 SCAN3 to a first additional output node NO1, and a scan signal 2 SCAN4 to a second additional output node NO2. In other words, the gate stage SG may receive the set signal SET and the first clock CLK1 having an ON level of a first phase, the second clock CLK2 having an ON level of a second phase which is later than the first phase, the third clock CLK3 having an ON level of a third phase which is later than the second phase, and the reset signal RESET and the fourth clock CLK4 having an ON level of a fourth phase which is later than the third phase and may output the carry signal CRY having an ON level of the second phase to the carry output node CNO. Also, the gate stage SG may receive the scan clock 1 SCLK3 having an ON level of the second phase to output the scan signal 1 SCAN3 having an ON level of the second phase to the first additional output node NO1 and may receive the scan clock 2 SCLK4 having an ON level of an intermediate phase partially overlapping the second phase and the third phase to output the scan signal 2 SCAN4 having an ON level of the intermediate phase to the second additional output node NO2. In this case, an on-level phase of the start signal VST may be earlier than or equal to the set signal SET.

The gate stage SG may include first serially-connected transistors T1a, T1, and T2 for applying the set signal SET having an ON level to a node Q on the basis of the first clock CLK1, second serially-connected transistors T3 and T4 for applying the second clock signal CLK2 having an OFF level to the node Q on the basis of the reset signal RESET and a voltage of a node Qb, a fifth transistor T5 for applying the fourth clock CLK4 having an ON level to the node Qb, a sixth transistor T6 for applying the fourth clock CLK4 having an OFF level to the node Qb on the basis of the set signal SET, a pull-up transistor T7 for applying the second clock CLK2 to the carry output node CNO on the basis of a voltage of the node Q, a pull-down transistor T8 for applying the start signal VST having an OFF level to the carry output node CNO on the basis of a voltage of the node Qb, a first additional pull-up transistor T7A for applying the scan clock 1 SCLK3 to the first additional output node NO1 on the basis of a voltage of the node Q, a first additional pull-down transistor T8A for applying the start signal VST having an OFF level to the first additional output node NO1 on the basis of a voltage of the node Qb, a second additional pull-up transistor T7B for applying the scan clock 2 SCLK4 to the second additional output node NO2 on the basis of a voltage of the node Q, and a leakage current blocker LCB for blocking a leakage current of the first serially-connected transistors T1a, T1, and T2 and the second serially-connected transistors T3 and T4 in a period where the node Q is floated. Here, the first serially-connected transistors T1a, T1, and T2 may include a first additional transistor T1a, a first transistor T1, and a second transistor T2 serially connected to one another, and the second serially-connected transistors T3 and T4 may include a third transistor T3 and a fourth transistor T4 serially connected to each other.

The leakage current blocker LCB may apply the second clock CLK2 having an ON level to a first node NA between the first serially-connected transistors T1 and T2, apply the third clock CLK3 having an ON level to a second node NB between the second serially-connected transistors T3 and T4, and apply the third clock CLK3 having an ON level to a third node NC between the second serially-connected transistors T1a and T1 in a period where the node Q is floated, thereby preventing abnormal discharging of the node Q and distortion of a scan signal SCAN caused thereby. In this case, the second clock CLK2 having an ON level may not overlap the third clock CLK3 having an ON level, and thus, an effect where a reverse bias application period with respect to serially-connected transistors increases may be obtained. In some embodiments, based on a clock design, the second clock CLK2 having an ON level may partially overlap the third clock CLK3 having an ON level.

The leakage current blocker LCB may include a first blocking transistor TA which applies the second clock CLK2 having an ON level to a first node NA between the first transistor T1 and the second transistor T2, a second blocking transistor TB which applies the third clock CLK3 having an ON level to a second node NB between the third transistor T3 and the fourth transistor T4, and a third blocking transistor TC which applies the third clock CLK3 having an ON level to a third node NC between the first additional transistor T1a and the first transistor T1.

A gate electrode and a first electrode of the first blocking transistor TA may be connected to an input terminal for the second clock CLK2, and a second electrode of the first blocking transistor TA may be connected to the first node NA. A gate electrode and a first electrode of the second blocking transistor TB may be connected to an input terminal for the third clock CLK3, and a second electrode of the second blocking transistor TB may be connected to the second node NB. A gate electrode and a first electrode of the third blocking transistor TC may be connected to an input terminal for the third clock CLK3, and a second electrode of the third blocking transistor TC may be connected to the third node NC.

The first clock CLK1 may have an OFF level in a period where the node Q is floated, and in this case, when the second clock CLK2 having an ON level is applied to the first node NA, a gate-source voltage of each of the first transistor T1 and the second transistor T2 may be a sufficient negative (−) voltage. Accordingly, even when a threshold voltage of each of the first transistor T1 and the second transistor T2 is shifted in a negative (−) direction by peripheral light, the first transistor T1 and the second transistor T2 may maintain an off state, and an abnormal leakage current may be prevented from occurring in the first transistor T1 and the second transistor T2.

Moreover, the first clock CLK1 may have an OFF level in a period where the node Q is floated, and in this case, when the third clock CLK3 having an ON level is applied to the third node NC, a gate-source voltage of each of the first additional transistor T1a and the first transistor T1 may be a sufficient negative (−) voltage. Accordingly, even when a threshold voltage of each of the first additional transistor T1a and the first transistor T1 is shifted in a negative (−) direction by peripheral light, the first additional transistor T1a and the first transistor T1 may maintain an off state, and an abnormal leakage current may be prevented from occurring in the first additional transistor T1a and the first transistor T1.

Moreover, the reset signal RESET and a voltage of the node Qb may have an OFF level in a period where the node Q is floated, and in this case, when the third clock CLK3 having an ON level is applied to the second node NB, a gate-source voltage of each of the third transistor T3 and the fourth transistor T4 may be a sufficient negative (−) voltage. Accordingly, even when a threshold voltage of each of the third transistor T3 and the fourth transistor T4 is shifted in a negative (−) direction by peripheral light, the third transistor T3 and the fourth transistor T4 may maintain an off state, and an abnormal leakage current may be prevented from occurring in the third transistor T3 and the fourth transistor T4.

In some embodiments, a channel size of the first blocking transistor TA is less than a channel size of each of the first transistor T1, the second transistor T2, and the first additional transistor T1a. A channel size of the second blocking transistor TB is less than a channel size of each of the third transistor T3 and the fourth transistor T4. A channel size of the third blocking transistor TC is less than a channel size of each of the first transistor T1, the second transistor T2, and the first additional transistor T1a. Furthermore, for the stability of an operation and a narrow formation area of a gate stage, it may be configured that a channel size of each of the first, second, and third blocking transistors TA, TB, and TC is less than that of each of the first, first additional, second, third, fourth, fifth and sixth transistors T1, T1a, T2, T3, T4, T5, and T6. For example, it may be designed that a channel size of each of the first and second blocking transistors TA and TB is 1/10 to 1/5 times a channel size of each of the first, first additional, second, third, fourth, fifth and sixth transistors T1, T1a, T2, T3, T4, T5, and T6. Also, in order to improve an output response characteristic of a scan signal, it may be designed that a channel size of each of the pull-up transistor T7 and the pull-down transistor T8 is greater than that of each of the first, first additional, second, third, fourth, fifth and sixth transistors T1, T1a, T2, T3, T4, T5, and T6. For example, it may be configured that a channel size of each of the pull-up transistor T7 and the pull-down transistor T8 is 10 times a channel size of each of the first, first additional, second, third, fourth, fifth and sixth transistors T1, T1a, T2, T3, T4, T5, and T6.

Figure 13A:
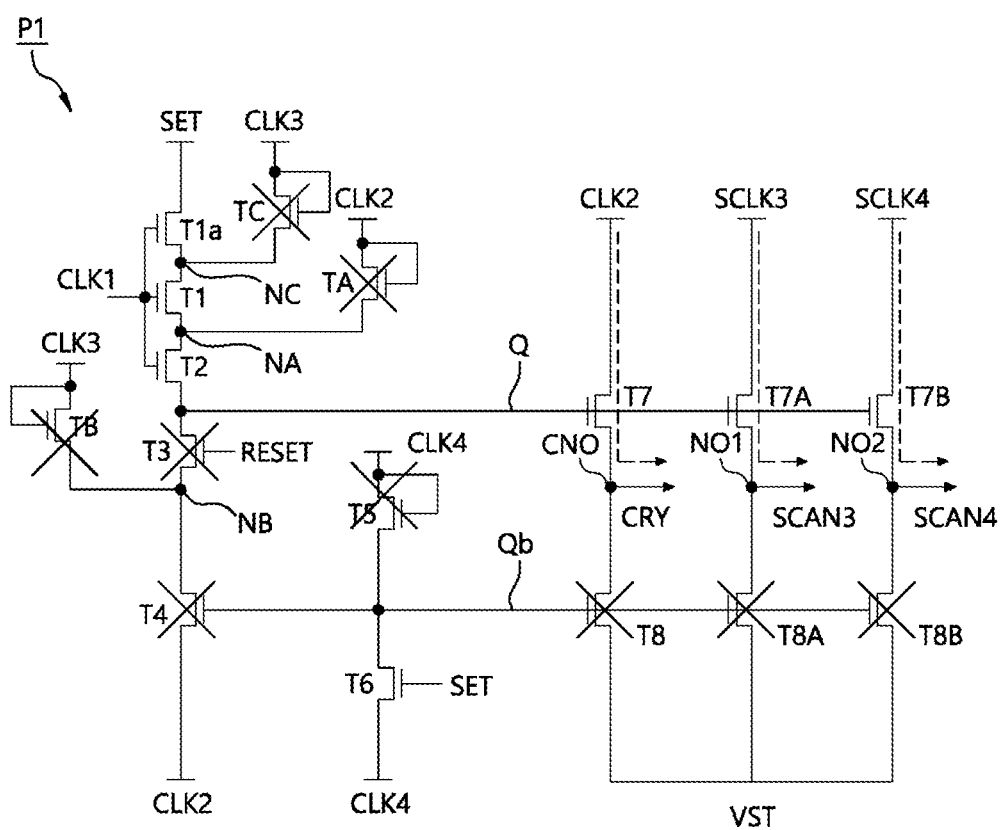
FIG. 13A is a diagram illustrating an operating state of the gate stage in a first period of FIG. 12.
Figure 13B:
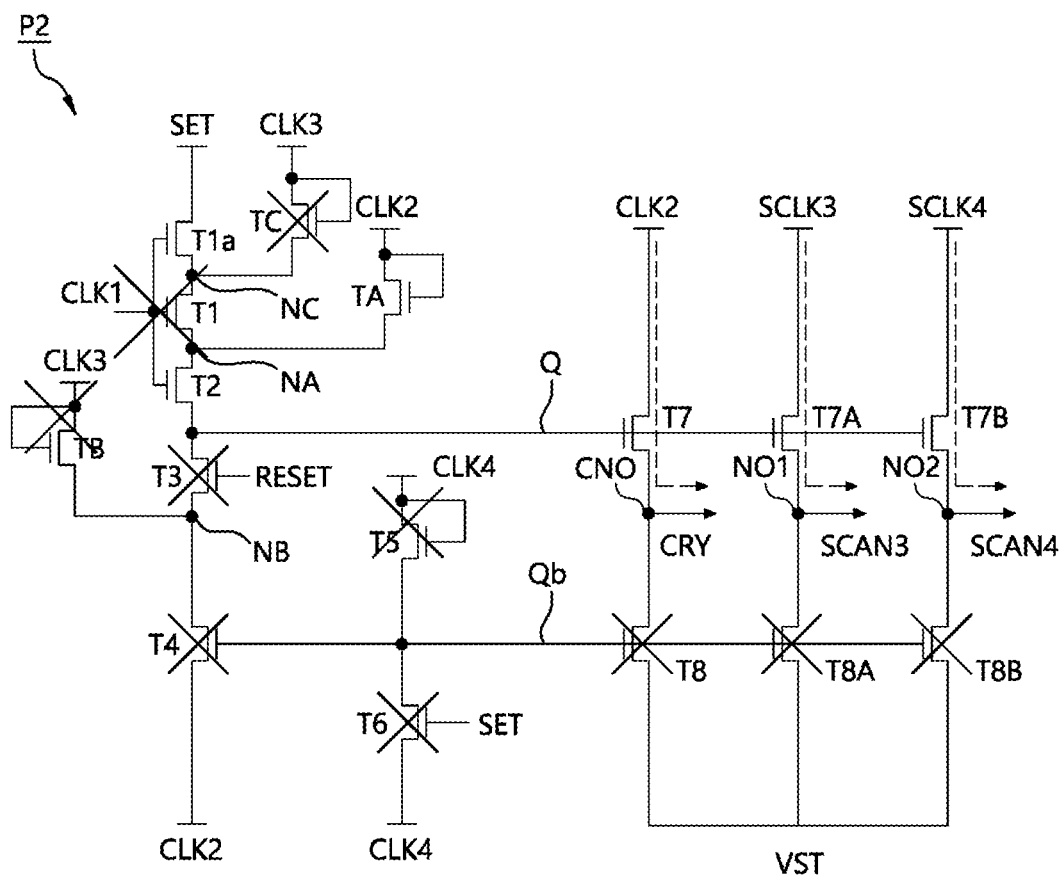
FIG. 13B is a diagram illustrating an operating state of the gate stage in a second period of FIG. 12.
Figure 13C:
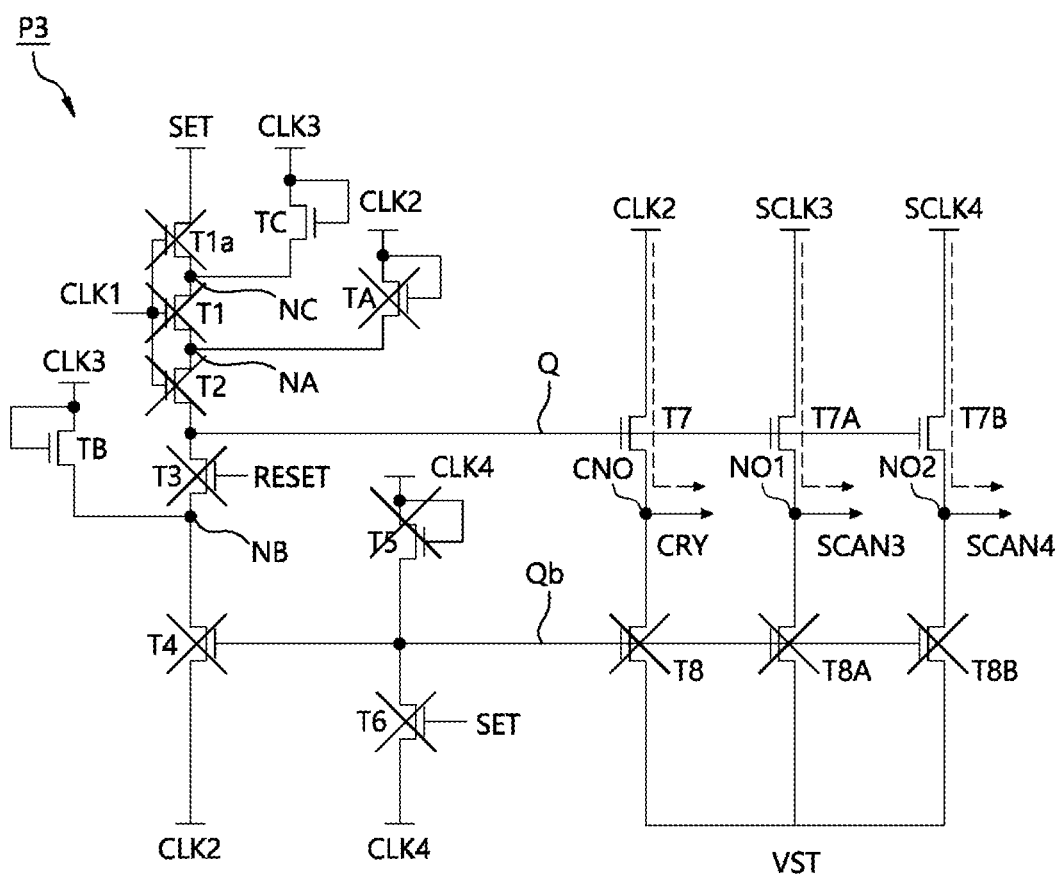
FIG. 13C is a diagram illustrating an operating state of the gate stage in a third period of FIG. 12.
Figure 13D:
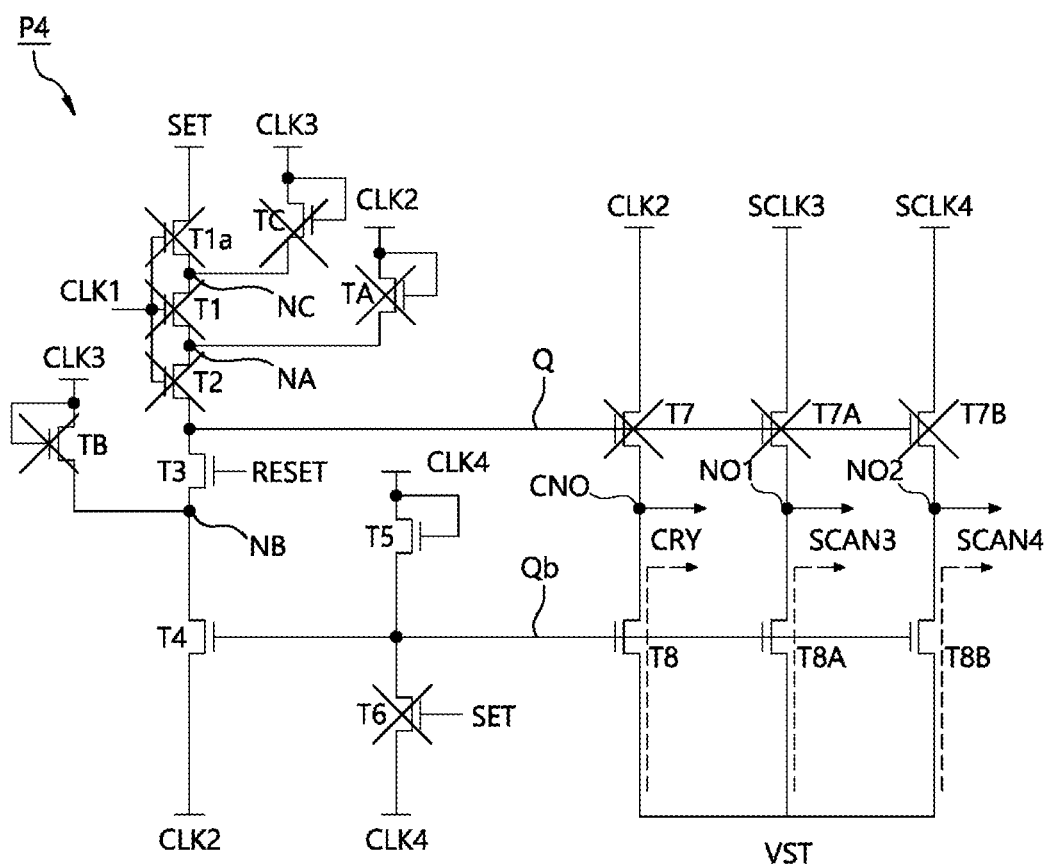
FIG. 13D is a diagram illustrating an operating state of the gate stage in a fourth period of FIG. 12.

FIG. 13A is a diagram illustrating an operating state of the gate stage in a first period of FIG. 12. FIG. 13B is a diagram illustrating an operating state of the gate stage in a second period of FIG. 12. FIG. 13C is a diagram illustrating an operating state of the gate stage in a third period of FIG. 12. FIG. 13D is a diagram illustrating an operating state of the gate stage in a fourth period of FIG. 12.

A configuration and an operation of a gate stage SG will be additionally described with reference to FIGS. 13A to 13D in conjunction with FIG. 12.

Referring to FIGS. 12 and 13A, the first serially-connected transistors T1a, T1, and T2 may be turned on based on the first clock CLK1 having an ON level in a first period P1 and may apply the set signal SET having an ON level to the node Q. The first clock CLK1 and the set signal SET may have an ON level in the first period P1. The sixth transistor T6 may be turned on based on the set signal SET having an ON level in the first period P1 and may apply the fourth clock CLK4 having an OFF level to the node Qb.

Referring to FIGS. 12 and 13B, the pull-up transistor T7 may be turned on based on a voltage of the node Q bootstrapped from an ON level in a second period P2 succeeding the first period P1 and may apply the second clock CLK2, which is later in on-level phase than the first clock CLK1, to the carry output node CNO. The second clock CLK2 may have an ON level in the second period P2. In the second period P2, the carry output node CNO may output the carry signal CRY having an ON level based on the second clock CLK2.

Furthermore, the first additional pull-up transistor T7A may be turned on based on a voltage of the node Q in the second period P2 and may apply the scan clock 1 SCLK3, having the same on-level phase as that of the second clock CLK2, to the first additional output node NO1. In the second period P2, the first additional output node NO1 may output an on-level scan signal 1 SCAN3 based on the scan clock 1 SCLK3.

Moreover, the second additional pull-up transistor T7B may be turned on based on a voltage of the node Q in the second period P2 and a third period P3 and may apply the second clock CLK2 and the third clock CLK3, having an on-level phase, to the second additional output node NO2. In the second period P2 and the third period P3, the second additional output node NO2 may output an on-level scan signal 2 SCAN4 based on the scan clock 2 SCLK4.

Referring to FIGS. 12 and 13C, the third period P3 may be arranged between the second period P2 and a fourth period P4. In the second period P2 and the third period P3, because the first serially-connected transistors T1a, T1, and T2 and the second serially-connected transistors T3 and T4 are turned off, the node Q may be floated. In the second period P2 and the third period P3 where the node Q is floated, the leakage current blocker LCB may block a leakage current through the first serially-connected transistors T1a, T1, and T2 and the second serially-connected transistors T3 and T4 on the basis of the second clock CLK2 having an ON level and the third clock CLK3 having an ON level.

Referring to FIGS. 12 and 13D, each of the second serially-connected transistors T3 and T4 may be turned on based on the reset signal RESET having an ON level and a voltage of the node Qb in the fourth period P4 and may apply the second clock CLK2 having an OFF level to the node Q. The reset signal RESET and the voltage of the node Qb may have an ON level in the fourth period P4.

In the fourth period P4, the fifth transistor T5 may apply the fourth clock CLK4 having an ON level to the node Qb in the fourth period P4, and the fourth clock CLK4 having an ON level may be later in phase than the third clock CLK3 having an ON level.

The pull-down transistor T8 may be turned on with a voltage of the node Qb based on the fourth clock CLK4 having an ON level and may apply the start signal VST having an OFF level to the carry output node CNO.

Moreover, in the fourth period P4, the first additional pull-down transistor T8A may be turned on with a voltage of the node Qb and may apply the start signal VST having an OFF level to the first additional output node NO1, and the second additional pull-down transistor T8B may be turned on with the voltage of the node Qb and may apply the start signal VST having an OFF level to the second additional output node NO2.

The start signal VST may maintain an ON level during only a certain period in one frame and may maintain an OFF level during the other period, except for the certain period, of the one frame, and the certain period may be a first on level period of the first clock CLK1 or may be earlier than the first on level period of the first clock CLK1.

Figure 14:
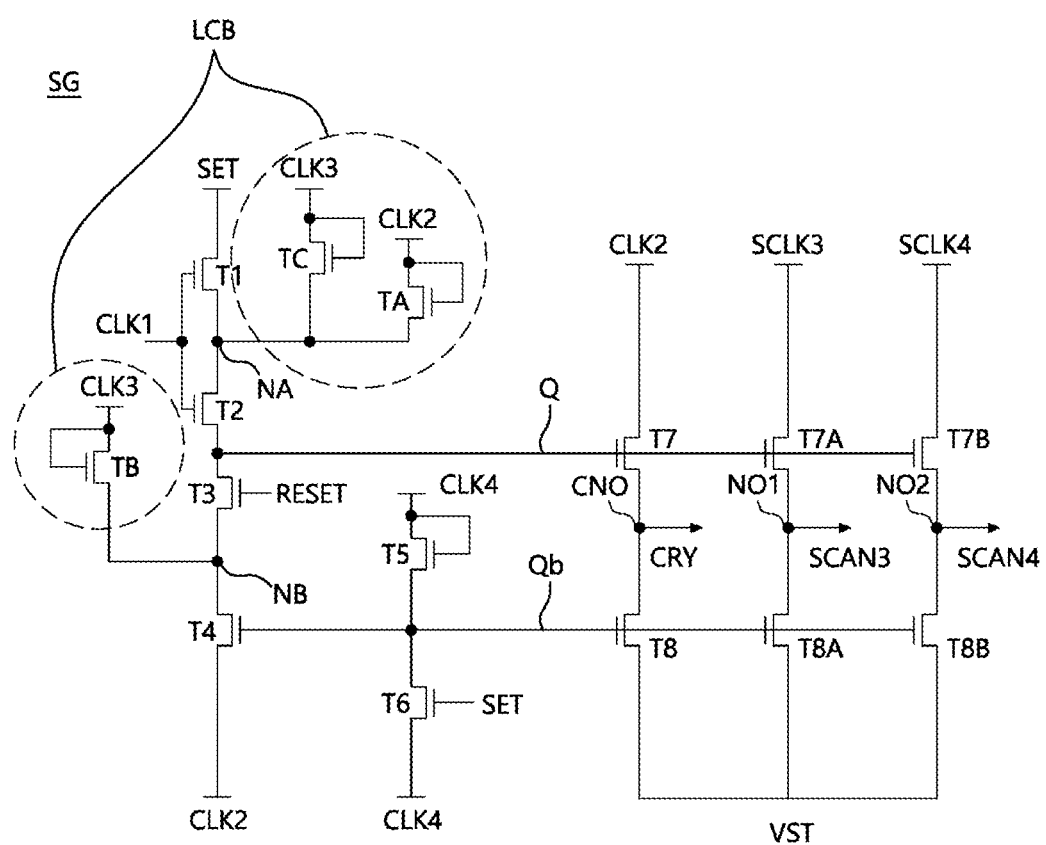
FIG. 14 is a diagram illustrating another circuit configuration of a gate stage included in the gate driver according to the second embodiment.
Figure 15:
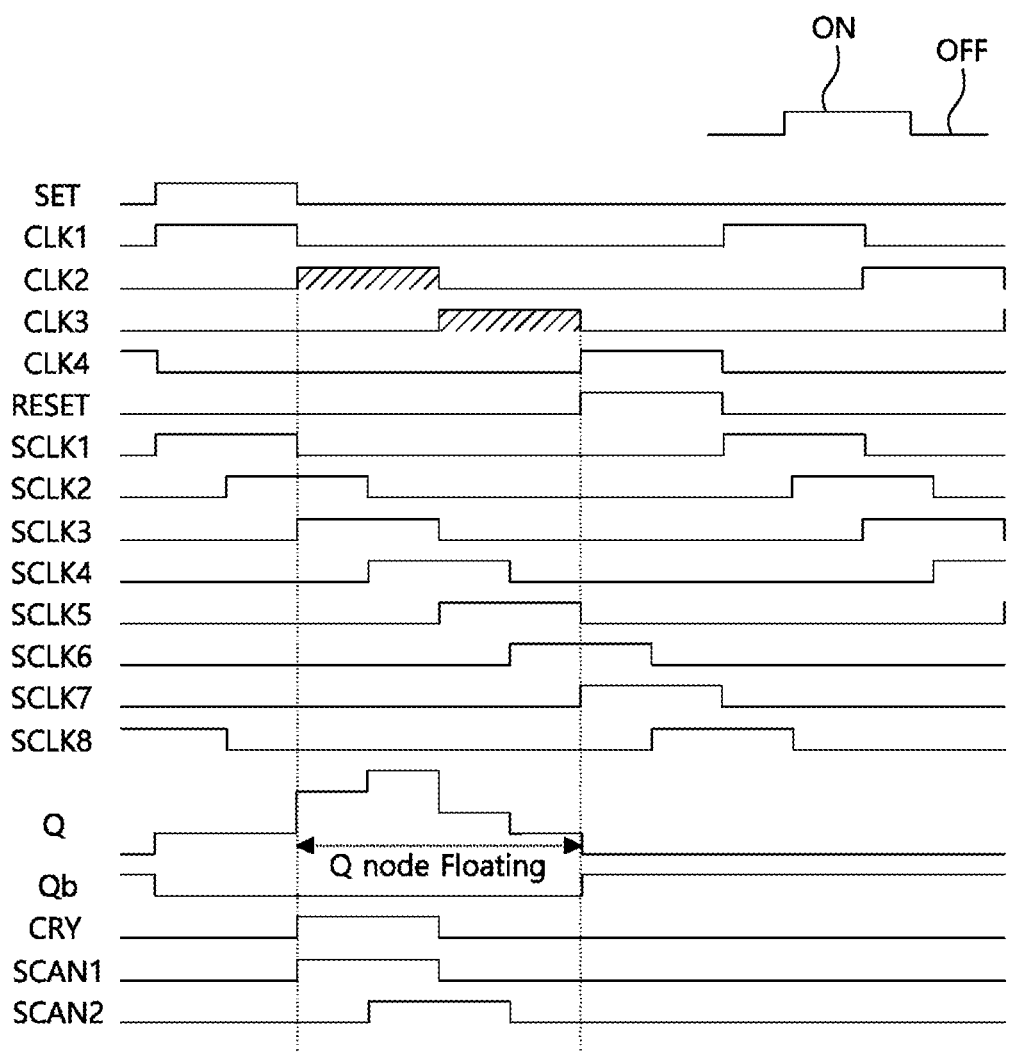
FIG. 15 is a diagram showing an operation waveform of the gate stage of FIG. 14.

FIG. 14 is a diagram illustrating another circuit configuration of a gate stage included in the gate driver according to the second embodiment. FIG. 15 is a diagram showing an operation waveform of the gate stage of FIG. 14.

Referring to FIGS. 14 and 15, comparing with the gate stage SG of FIG. 11, the gate stage SG may have a difference in the connection configuration of the leakage current blocker LCB, and the other elements may be substantially the same as those of the gate stage SG of FIG. 11. FIG. 14 may be simplified more in configuration than the gate stage SG of FIG. 11.

A leakage current blocker LCB included in the gate stage SG may apply a second clock CLK2 having an ON level and a third clock CLK3 having an ON level to a first node NA between first serially-connected transistors T1 and T2 and may apply a third clock CLK3 having an ON level to a second node NB between second serially-connected transistors T3 and T4 in a second period P2 and a third period P3 where the node Q is floated, thereby preventing abnormal discharging of the node Q and distortion of a scan signal SCAN caused thereby. In this case, the second clock CLK2 having an ON level may not overlap the third clock CLK3 having an ON level, and thus, an effect where a reverse bias application period with respect to serially-connected transistors increases may be obtained. In some embodiments, based on a clock design, the second clock CLK2 having an ON level may partially overlap the third clock CLK3 having an ON level.

The leakage current blocker LCB may include a first blocking transistor TA which applies the second clock CLK2 having an ON level to a first node NA between the first transistor T1 and the second transistor T2 in the second period P2, a third blocking transistor TC which applies the third clock CLK3 having an ON level to the first node NA in the third period P3, and a second blocking transistor TB which applies the third clock CLK3 having an ON level to a second node NB between the third transistor T3 and the fourth transistor T4.

A gate electrode and a first electrode of the first blocking transistor TA may be connected to an input terminal for the second clock CLK2, and a second electrode of the first blocking transistor TA may be connected to the first node NA. A gate electrode and a first electrode of the second blocking transistor TB may be connected to an input terminal for the third clock CLK3, and a second electrode of the second blocking transistor TB may be connected to the second node NB. A gate electrode and a first electrode of the third blocking transistor TC may be connected to an input terminal for the third clock CLK3, and a second electrode of the third blocking transistor TC may be connected to the first node NA.

The first clock CLK1 may have an OFF level in a period where the node Q is floated, and in this case, when the second clock CLK2 and the third clock CLK3 having an ON level is applied to the first node NA, a gate-source voltage of each of the first transistor T1 and the second transistor T2 may be a sufficient negative (−) voltage. Accordingly, even when a threshold voltage of each of the first transistor T1 and the second transistor T2 is shifted in a negative (−) direction by peripheral light, the first transistor T1 and the second transistor T2 may maintain an off state, and an abnormal leakage current may be prevented from occurring in the first transistor T1 and the second transistor T2.

Moreover, the reset signal RESET and a voltage of the node Qb may have an OFF level in a period where the node Q is floated, and in this case, when the third clock CLK3 having an ON level is applied to the second node NB, a gate-source voltage of each of the third transistor T3 and the fourth transistor T4 may be a sufficient negative (−) voltage. Accordingly, even when a threshold voltage of each of the third transistor T3 and the fourth transistor T4 is shifted in a negative (−) direction by peripheral light, the third transistor T3 and the fourth transistor T4 may maintain an off state, and an abnormal leakage current may be prevented from occurring in the third transistor T3 and the fourth transistor T4.

Furthermore, for the stability of an operation and a narrow formation area of a gate stage, it may be configured that a channel size of each of the first, second, and third blocking transistors TA, TB, and TC is less than that of each of the first, second, third, fourth, fifth, and sixth transistors T1, T2, T3, T4, T5, and T6. For example, it may be designed that a channel size of each of the first and second blocking transistors TA and TB is 1/10 to 1/5 times a channel size of each of the first, second, third, fourth, fifth, and sixth transistors T1, T2, T3, T4, T5, and T6. Also, in order to improve an output response characteristic of a scan signal, it may be configured that a channel size of each of the pull-up transistor T7 and the pull-down transistor T8 is greater than that of each of the first, second, third, fourth, fifth, and sixth transistors T1, T2, T3, T4, T5, and T6. For example, it may be configured that a channel size of each of the pull-up transistor T7 and the pull-down transistor T8 is 10 times a channel size of each of the first, second, third, fourth, fifth, and sixth transistors T1, T2, T3, T4, T5, and T6.

In the gate driver and the electroluminescent display apparatus including the same according to the embodiments of the present disclosure, configurations of gate stages may be simplified, and thus, a narrow bezel may be implemented In the gate driver and the electroluminescent display apparatus including the same according to the embodiments of the present disclosure, gate stages may be simplified in configuration to operate based on a clock without a driving power and each of the gate stages may include a leakage current blocker, thereby increasing operation stability.

The effects according to the present disclosure are not limited to the above examples, and other various effects may be included in the specification.

While the present disclosure has been particularly shown and described with reference to example embodiments thereof, it will be understood by those of ordinary skill in the art that various changes in form and details may be made therein without departing from the spirit and scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A gate driver including a plurality of stages, each of the plurality of stages comprising:
   first serially-connected transistors each configured to be turned on based on a first clock signal having an on level in a first period to apply a set signal having an on level to a first control node;
   a pull-up transistor configured to be turned on based on a voltage of the first control node bootstrapped from the on level in a second period succeeding the first period to apply a second clock signal, which is later in on-level phase than the first clock signal, to an output node;
   second serially-connected transistors turned on based on a reset signal having an on level and a voltage of a second control node in a fourth period later than the second period to apply the second clock signal having an off level to the first control node; and
   a leakage current blocker for blocking a leakage current of the first serially-connected transistors and the second serially-connected transistors based on the second clock having an on level in the second period and a third clock signal having an on level in a third period between the second period and the fourth period, when the first control node floats.

2. The gate driver of claim 1, wherein the first serially-connected transistors comprise a first transistor and a second transistor serially connected to each other,
   the second serially-connected transistors comprise a third transistor and a fourth transistor serially connected to each other, and
   the leakage current blocker comprises:
      a first blocking transistor configured to apply the second clock signal having the on level to a first node between the first transistor and the second transistor in the second period; and
      a second blocking transistor configured to apply the third clock signal having the on level to a second node between the third transistor and the fourth transistor in the third period.

3. The gate driver of claim 2, wherein a gate electrode and a first electrode of the first blocking transistor is connected to an input terminal for receiving the second clock signal, and a second electrode of the first blocking transistor is connected to the first node, and
   a gate electrode and a first electrode of the second blocking transistor is connected to an input terminal for receiving the third clock signal, and a second electrode of the second blocking transistor is connected to the second node.

4. The gate driver of claim 2, wherein a channel size of the first blocking transistor is less than a channel size of each of the first transistor and the second transistor, and
   a channel size of the second blocking transistor is less than a channel size of each of the third transistor and the fourth transistor.

5. The gate driver of claim 1, wherein the output node includes a first additional output node and a second additional output node, and each of the plurality of stages further comprises:
   a first additional pull-up transistor configured to be turned on based on the voltage of the first control node in the second period to apply a first additional clock signal to the first additional output node; and
   a second additional pull-up transistor configured to be turned on based on the voltage of the first control node in the second period and the third period to apply a second additional clock signal to the second additional output node,
   wherein the first additional clock signal has a same on-level phase as an on-level phase of the second clock signal, and
   wherein the second additional clock signal partially overlaps the second clock signal and the third clock signal in on-level phase.

6. The gate driver of claim 5, wherein the first serially-connected transistors comprise a first additional transistor, a first transistor, and a second transistor connected to one another in series,
   the second serially-connected transistors comprise a third transistor and a fourth transistor serially connected to each other, and
   the leakage current blocker comprises:
      a first blocking transistor configured to apply the second clock signal having the on level to a first node between the first transistor and the second transistor in the second period;
      a second blocking transistor configured to apply the third clock signal having the on level to a second node between the third transistor and the fourth transistor in the third period; and
      a third blocking transistor configured to apply the third clock signal having the on level to a third node between the first additional transistor and the first transistor in the third period.

7. The gate driver of claim 6, wherein a gate electrode and a first electrode of the first blocking transistor are connected to an input terminal for receiving the second clock signal, and a second electrode of the first blocking transistor is connected to the first node,
   a gate electrode and a first electrode of the second blocking transistor are connected to an input terminal for receiving the third clock signal, and a second electrode of the second blocking transistor is connected to the second node, and
   a gate electrode and a first electrode of the third blocking transistor is connected to the input terminal for receiving the third clock signal, and a second electrode of the third blocking transistor is connected to the third node.

8. The gate driver of claim 6, wherein a channel size of the first blocking transistor is less than a channel size of each of the first transistor, the second transistor, and the first additional transistor,
   a channel size of the second blocking transistor is less than a channel size of each of the third transistor and the fourth transistor, and
   a channel size of the third blocking transistor is less than the channel size of each of the first transistor, the second transistor, and the first additional transistor.

9. The gate driver of claim 5, wherein the first serially-connected transistors comprise a first transistor and a second transistor serially connected to each other,
the second serially-connected transistors comprise a third transistor and a fourth transistor serially connected to each other, and
the leakage current blocker comprises:
a first blocking transistor configured to apply the second clock signal having the on level to a first node between the first transistor and the second transistor in the second period; and
a second blocking transistor configured to apply the third clock signal having the on level to a second node between the third transistor and the fourth transistor in the third period; and
a third blocking transistor configured to apply the third clock signal having the on level to the first node in the third period.

10. The gate driver of claim 9, wherein a gate electrode and a first electrode of the first blocking transistor are connected to an input terminal for receiving the second clock signal, and a second electrode of the first blocking transistor is connected to the first node,
a gate electrode and a first electrode of the second blocking transistor are connected to an input terminal for receiving the third clock signal, and a second electrode of the second blocking transistor is connected to the second node, and
a gate electrode and a first electrode of the third blocking transistor is connected to an input terminal for receiving the third clock signal, and a second electrode of the third blocking transistor is connected to the first node.

11. The gate driver of claim 9, wherein a channel size of the first blocking transistor is less than a channel size of each of the first transistor and the second transistor,
a channel size of the second blocking transistor is less than a channel size of each of the third transistor and the fourth transistor, and
a channel size of the third blocking transistor is less than the channel size of each of the first transistor and the second transistor.

12. The gate driver of claim 1, wherein the second clock signal having the on level offset from the third clock signal having the on level.

13. The gate driver of claim 1, wherein the second clock signal having the on level partially overlaps the third clock signal having the on level.

14. The gate driver of claim 1, wherein each of the plurality of stages comprises:
a fifth transistor configured to apply a fourth clock signal having an on level to the second control node in the fourth period, the fourth clock signal having the on level and a phase which is later than a phase of the third clock signal having the on level;
a pull-down transistor configured to be turned on based on a voltage of the second control node based on the fourth clock signal having the on level in the fourth period to apply a start signal having an off level to the output node; and
a sixth transistor configured to be turned on based on the set signal having the on level in the first period to apply a fourth clock signal having an off level to the second control node,
wherein the start signal is configured to maintain an on level during only a period in one frame and maintain an off level during another period of the one frame, and the period in the one frame is a first on level period of the first clock signal.

15. The gate driver of claim 1, wherein each of the plurality of stages further comprises:
a first additional pull-up transistor configured to be turned on based on a voltage of the first control node in the second period to apply a first scan clock signal to a first additional output node, the first scan clock signal having a same on-level phase as an on-level phase of the second clock signal;
a second additional pull-up transistor configured to be turned on based on a voltage of the first control node in the second period and the third period to apply a second scan clock signal to a second additional output node, where an on-level phase of the second scan clock signal partially overlaps the second clock signal and the third clock signal;
a fifth transistor configured to apply a fourth clock signal having an on level to the second control node in the fourth period, a phase of the on level of the fourth clock signal being later than a phase of the on level of the third clock signal;
a pull-down transistor configured to be turned on according to a voltage of the second control node based on the fourth clock signal having the on level in the fourth period to apply a start signal having an off level to the output node;
a first additional pull-down transistor configured to be turned on according to the voltage of the second control node based on the fourth clock signal having the on level in the fourth period to apply the start signal having the off level to the first additional output node;
a second additional pull-down transistor configured to be turned on according to the voltage of the second control node based on the fourth clock signal having the on level in the fourth period to apply the start signal having the off level to the second additional output node; and
a sixth transistor configured to be turned on based on the set signal having an on level in the first period to apply a fourth clock signal having an off level to the second control node,
wherein the start signal maintains an on level during only a period in one frame and maintains an off level during another period of the one frame, and
wherein the period in the one frame is a first on level period of the first clock signal.

16. An electroluminescent display apparatus comprising:
the gate driver of claim 1; and
a plurality of pixels each including a switching element operating based on a scan signal from the output node of the gate driver,
wherein the scan signal is supplied to a gate electrode of the switching element included in each of the plurality of pixels.

17. A gate driver including a plurality of stages, each of the plurality of stages in operation receiving a set signal and a first clock signal having an on level in a first phase, a second clock signal having an on level in a second phase which is later than the first phase, a third clock signal having an on level in a third phase which is later than the second phase, and a reset signal and a fourth clock signal each having an on level in a fourth phase which is later than the third phase, to output a scan signal having an on level in the second phase to an output node, wherein each of the plurality of stages comprises:
first serially-connected transistors configured to apply the set signal having an on level to a first control node based on the first clock signal;
second serially-connected transistors configured to apply the second clock signal having an off level to the first control node based on the reset signal and a voltage of a second control node;
a fifth transistor configured to apply the fourth clock signal having an on level to the second control node;
a sixth transistor configured to apply the fourth clock signal having an off level to the second control node based on the set signal;
a pull-up transistor configured to apply the second clock signal to the output node based on a voltage of the first control node;
a pull-down transistor configured to apply a start signal having an off level to the output node based on the voltage of the second control node; and
a leakage current blocker configured to apply the second clock signal having the on level to a first node between the first serially-connected transistors and applying the third clock signal having the on level to a second node between the second serially-connected transistors, in a period where the first control node floats.

18. The gate driver of claim 17, wherein the first serially-connected transistors comprise a first transistor and a second transistor serially connected to each other,
the second serially-connected transistors comprise a third transistor and a fourth transistor serially connected to each other, and
the leakage current blocker comprises:
a first blocking transistor configured to apply the second clock signal having the on level to the first node between the first transistor and the second transistor; and
a second blocking transistor configured to apply the third clock signal having the on level to the second node between the third transistor and the fourth transistor.

19. The gate driver of claim 18, wherein a gate electrode and a first electrode of the first blocking transistor is connected to an input terminal for receiving the second clock signal, and a second electrode of the first blocking transistor is connected to the first node, and
a gate electrode and a first electrode of the second blocking transistor is connected to an input terminal for receiving the third clock signal, and a second electrode of the second blocking transistor is connected to the second node.

20. The gate driver of claim 18, wherein a channel size of the first blocking transistor is less than a channel size of each of the first transistor and the second transistor, and
a channel size of the second blocking transistor is less than a channel size of each of the third transistor and the fourth transistor.

21. A circuit, comprising
a pull-up transistor having a control terminal;
first serially-connected transistors coupled between a first input terminal and the control terminal of the pull-up transistor, the first serially-connected transistors configured to be turned on in a first phase of a clock frame;
second serially-connected transistors coupled between a second input terminal and the control terminal of the pull-up transistor, the second serially-connected transistors configured to be turned on in a fourth phase of the clock frame;
a first blocking transistor configured to apply a first on level signal to a first node of the first serially-connected transistors in a second phase of the clock frame subsequent to the first phase; and
a second blocking transistor configured to apply a second on level signal to a second node of the second serially-connected transistors in a third phase of the clock frame subsequent to the second phase,
wherein the second phase and the third phase do not coincide with each other.

22. The circuit of claim 21, wherein the first serially-connected transistors comprise a first transistor and a second transistor serially connected to each other with the first node between the first transistor and the second transistor, and
the second serially-connected transistors comprise a third transistor and a fourth transistor serially connected to each other with the second node between the third transistor and the fourth transistor.

* * * * *